United States Patent
Chang et al.

(10) Patent No.: US 7,838,205 B2
(45) Date of Patent: Nov. 23, 2010

(54) UTILIZATION OF ELECTRIC FIELD WITH ISOTROPIC DEVELOPMENT IN PHOTOLITHOGRAPHY

(75) Inventors: Vincent Chang, Hsin-Chu (TW); Kuei Shun Chen, Hsin-Chu (TW); George Liu, Hsin-Chu (TW); Norman Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 589 days.

(21) Appl. No.: 11/456,152

(22) Filed: Jul. 7, 2006

(65) Prior Publication Data

US 2008/0008967 A1 Jan. 10, 2008

(51) Int. Cl.
*G03F 7/26* (2006.01)

(52) U.S. Cl. .................... 430/325; 430/322; 430/330

(58) Field of Classification Search ................. 430/311, 430/322, 325, 330
See application file for complete search history.

(56) References Cited

U.S. PATENT DOCUMENTS

| 5,258,266 A * | 11/1993 | Tokui et al. .............. 430/326 |
| 2003/0008246 A1* | 1/2003 | Cheng et al. .............. 430/323 |
| 2004/0010769 A1* | 1/2004 | Chang et al. .............. 716/21 |
| 2006/0189146 A1* | 8/2006 | Oweyang et al. ........... 438/725 |

* cited by examiner

*Primary Examiner*—Kathleen Duda
(74) *Attorney, Agent, or Firm*—Haynes and Boone, LLP

(57) ABSTRACT

Photolithography processing methods by which a photoresist layer is deposited, a portion of the photoresist layer is exposed to electromagnetic radiation to transfer a reticle pattern thereto, and the exposed portion of the photoresist layer is treated with thermal energy while being subjected to an electric field, wherein the electric field is configured to substantially limit diffusion of the exposed photoresist layer portion to anisotropic diffusion.

18 Claims, 21 Drawing Sheets

UTILIZATION OF ELECTRIC FIELD WITH ISOTROPIC DEVELOPMENT IN PHOTOLITHOGRAPHY

BACKGROUND

Essential to wafer fabrication technology, photolithography defines the patterns that are transferred to the thin films and other elements that collectively form integrated circuits and other microelectronic devices. Typically, photolithography processing initially includes coating a photoresist material onto a wafer. A "soft-bake" may then be performed, such as to remove solvent from the undeveloped photoresist material. A reticle pattern is then photographically transferred to the photoresist by exposure to electromagnetic radiation through the reticle. A post-exposure bake (PEB) is often employed to complete the chemical reaction initiated by the photographic exposure. The photoresist then undergoes development to remove either the exposed portions of the photoresist (for "positive" photoresist) or the unexposed portions (for "negative" photoresist). Once the photoresist is developed, a "hard-bake" may be performed to further reduce solvent concentrations or adjust selectivity, among other objectives. The resulting pattern of photoresist remaining on the substrate is then employed during selective processing, such as to etch an underlying film by one or more processes to which the photoresist pattern is resistant. Thereafter, the photoresist pattern can be stripped in preparation for further processing, possibly including additional photolithography processing.

However, as the scale of devices manufactured by photolithographic processing continues decrease, conventional photolithography presents an increasing number of obstacles. For example, processing windows continue to shrink, wreaking havoc on production ability and yield. Shrinking feature dimensions are also requiring continually increasing resolution during photolithography, such that conventional photolithographic methods are now becoming known as low-resolution, often delaying the advent of further advances in other processing areas. As feature dimensions are scaled beyond the capabilities of existing photolithography, maintaining the parallelism of sidewalls of vias and other vertically extending features, as well as their perpendicularity or other desired orientation relative to horizontally extending features (e.g., substrates and material layers deposited thereon) are becoming progressively uncontrollable. This results in tapered and other undesired profiles of myriad features, whether at the active device level or in the interconnect structure thereof, which can compound exponentially, further decreasing yield and product quality.

BRIEF DESCRIPTION OF THE DRAWINGS

The present disclosure is best understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

DETAILED DESCRIPTION

Figure 1:
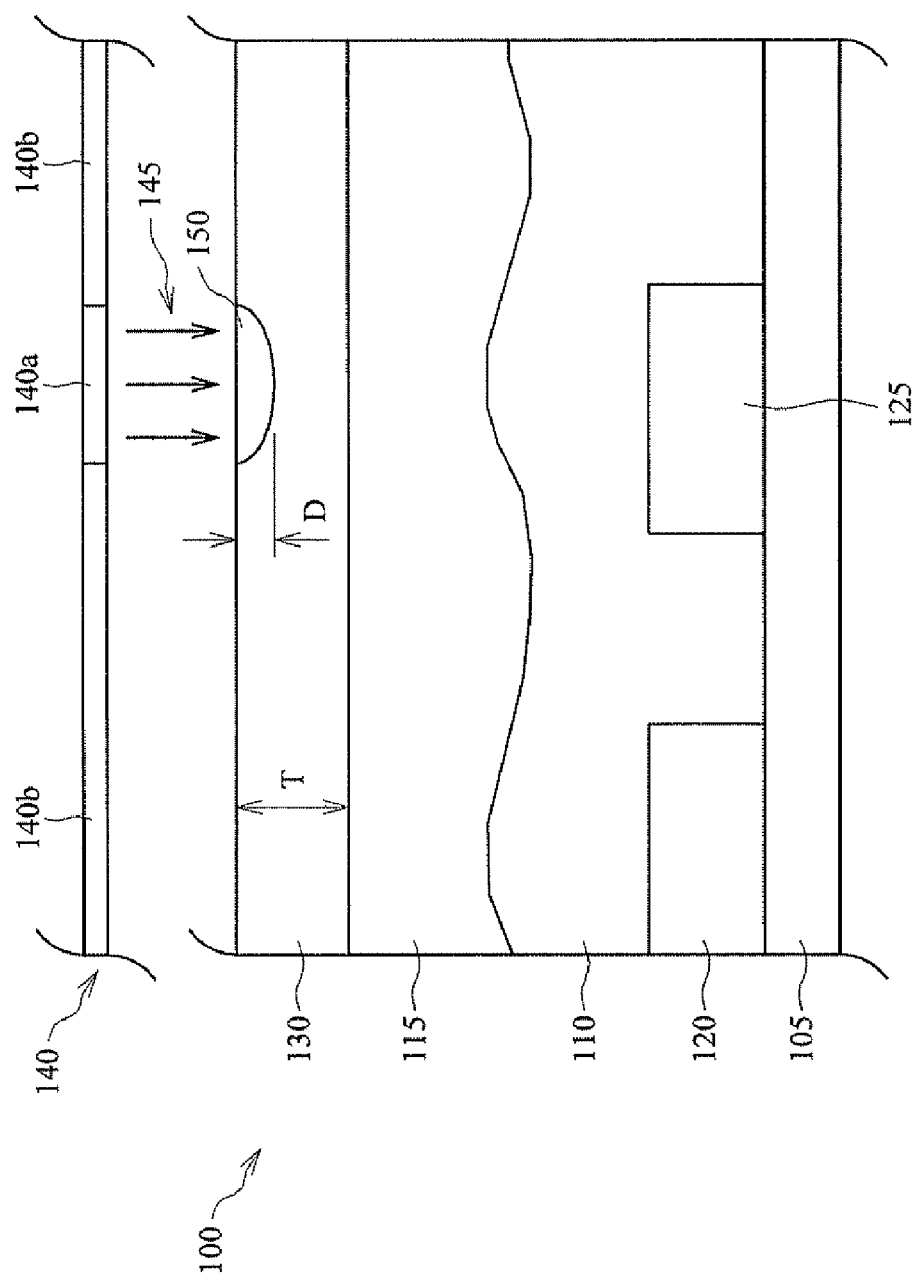
FIG. 1 is a sectional view of at least a portion of one embodiment of apparatus in an intermediate stage of manufacture according to aspects of the present disclosure.

It is to be understood that the following disclosure provides many different embodiments, or examples, for implementing different features of various embodiments. Specific examples of components and arrangements are described below to simplify the present disclosure. However, these are merely examples, and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a section view of at least a portion of one embodiment of an apparatus 100 in an intermediate stage of manufacture according to aspects of the present disclosure. The apparatus 100 may include or form at least a portion of a microelectronic device, such as an integrated circuit device, a memory device, a logic device, an electromechanical device, and/or combinations thereof, among others.

The apparatus 100 includes a substrate 105 having one or more layers and/or features formed thereon. In the embodiment shown in FIG. 1, the apparatus 100 includes layers 110, 115 and features 120, 125 formed over the substrate 105. However, the substrate 105, layer 110, layer 115, feature 120, and feature 125 shown in FIG. 1 are merely exemplary structure of the apparatus 100, provided to support demonstration of one or more photolithography aspects introduced in the present disclosure. Those skilled in the art will readily recognize that the apparatus 100 may, of course, include any number and configuration of layers and/or features other than as depicted in the embodiment shown in FIG. 1.

However, for example, the substrate 105 may comprise silicon, gallium arsenide, gallium nitride, strained silicon, silicon germanium, silicon carbide, carbide, diamond, and/or other materials. The substrate 105 may also be or comprise a silicon-on-insulator (SOI) substrate, such as a silicon-on-sapphire substrate, a silicon germanium-on-insulator substrate, or another substrate comprising an epitaxial semiconductor layer on an insulator layer.

The layers 110, 115 may each individually comprise one or more conductive materials, such as aluminum, carbon nanotubes, copper, gold, hafnium, molybdenum, polysilicon, silicide, silver, tantalum, tantalum nitride, titanium, titanium nitride, tungsten, alloys thereof, and/or other materials. One or more of the layers 110, 115 may alternatively comprise one or more dielectric materials, such as oxide, aluminum oxide, hafnium oxide, nitrided oxide, silicon dioxide, silicon oxynitride, tantalum oxide, thermal oxide, a nitrogen-containing dielectric material, a high-k dielectric material, and/or other materials. One or more of the layers 110, 115 may also be or include a seed layer comprising chromium, nickel, niobium, tungsten, vanadium, and/or other materials.

Exemplary fabrication processes which may be utilized to form the layers 110, 115 include imprint lithography, immersion photolithography, mask-less photolithography, chemical-vapor deposition (CVD), plasma-enhanced CVD (PECVD), atmospheric pressure CVD (APCVD), low-pressure CVD (LPCVD), physical-vapor deposition (PVD), electroplating, and atomic layer deposition (ALD), among others. The layers 110, 115 may also be patterned elements or layers, such as may be formed by selective growth, selective deposition, or blanket deposition followed by a patterning process.

The features 120, 125 may be substantially similar in composition and/or manufacture to such patterned embodiments of the layers 110, 115. For example, the features 120, 125 may each be a conductive element comprising one or more of the conductive materials described above, such as a transistor gate electrode or other conductive transistor contact, a conductive member of an interconnect structure, a conductive or charging-storing member of an inductive or capacitive device, or a via landing pad, among other examples. The features 120, 125 may each alternatively be a nonconductive element comprising one or more of the dielectric materials described above, such as a gate dielectric layer or an insulating portion separating two or more conductive members of an interconnect structure, among other examples. The features 120, 125 may each alternatively be a semiconductive element comprising doped or undoped silicon, germanium, or alloys thereof, among other possible materials, such as a channel region of a transistor device, among other examples.

In the manufacturing stage shown in FIG. 1, the apparatus 100 also includes a photoresist layer 130. The photoresist layer 130 may be formed on the layer 115 by spin-on coating and/or other processes configured to produce a thin, relatively uniform film. The photoresist layer 130 substantially comprises an undeveloped photoresist material (sometimes referred to as a photoresist matrix when in the undeveloped phase). The photoresist material may contain a polymer constituent and a photo-sensitive chemical constituent, as well as a solvent which keeps the polymer and photo-sensitive chemical in suspension.

After initially forming the photoresist layer 130, the solvent therein may be driven off by employing one or more soft-bake or pre-exposure bake processes. Such processing may entail exposure to high temperature for a predetermined duration. In one embodiment, the soft-bake processing may expose the photoresist layer 130 to a temperature ranging between about 90° C. and about 120° C. for a duration ranging between about one minute and about thirty minutes, depending on whether a hot plate, over, furnace, rapid thermal processing (RTP) apparatus, or other means is employed for such heat treatment. However, the scope of the present disclosure also includes embodiments in which the soft-bake or pre-exposure bake processing is performed at other temperatures and/or durations. In addition to removing residual solvent, the soft-bake may also increase adhesion of the photoresist layer 130 to the layer 115 and/or other underlying layers.

A reticle 140 having a pattern defined by transparent portions 140a and opaque portions 140b is then employed to begin patterning the photoresist layer 130. The reticle pattern is photographically transferred to the photoresist layer 130 by exposing the photoresist layer 130 to electromagnetic radiation 145 through the reticle. The electromagnetic radiation 145 comprises visible light, ultraviolet (UV) energy, deep ultraviolet (DUV) energy, and/or extreme ultraviolet (EUV) energy, although other exposure means may additionally or alternatively be employed (e.g., electron beam). The reticle pattern may correspond to several die and, accordingly, may be stepped across the wafer, exposing the pattern after each step.

The exposure of the photoresist layer 130 is configured to chemically change a portion 150 of the photoresist layer 130, wherein a surface area of the portion 150 substantially conforms or otherwise corresponds to the transparent portions 140a of the reticle 140. As shown in FIG. 1, the chemically-reacted portion 150 of the photoresist layer 130 may not span the thickness of the photoresist layer 130, which may be a result of the isotropic nature by which the portion 150 develops in the photoresist layer 130. For example, the depth D to which the portion 150 extends into the photoresist layer 130 may be less than about 50% of the thickness T of the photoresist layer 130. In other embodiments, the depth D may be about 25% or less of the thickness T of the photoresist layer 130, while in other embodiments the depth D may be about 10% or less of the thickness T of the photoresist layer 130.

Figure 2:
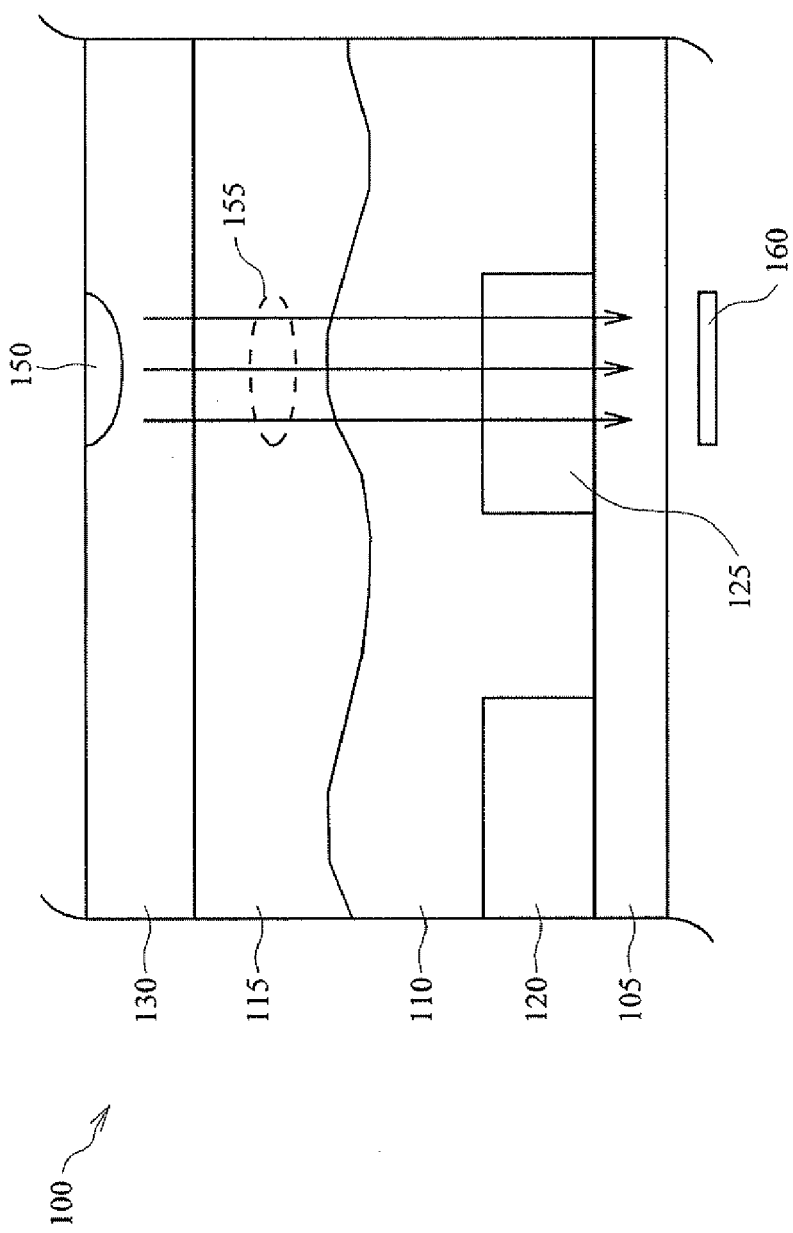
FIG. 2 is a sectional view of the apparatus shown in FIG. 1 in a subsequent stage of manufacture.

Referring to FIG. 2, illustrated is a sectional view of the apparatus 100 shown in FIG. 1 in a subsequent stage of manufacture, during which a post-exposure bake (PEB) is employed to complete the chemical reaction initiated by the exposure described above. The PEB may aid or catalyze the exposure-induced photo-reaction of a photo active compound (PAC) in the photoresist layer 130 that reacts to the exposure and undergoes or initiates a chemical change, forming the portion 150. The PEB may also stimulate diffusion of the PAC and reduce the effects of standing waves. For chemically amplified photoresists, the PEB may also cause a catalyzed chemical reaction that changes the solubility of the portion 150.

Process parameters for the PEB may be substantially similar to those employed during the pre-exposure bake. However, the PEB is performed in the presence of an electric field, which is depicted in FIG. 2 by field lines 155. The field lines 155 of the electric field are oriented such that the charged particles (e.g., hydrogen ions) of the exposed portion 150 are driven into the photoresist layer 130 substantially anisotropically. For example, the field lines 155 in the embodiment depicted in FIG. 2 are substantially non-parallel to a normal of the substrate 105, such that the exposed portion 150 is anisotropically developed in substantially the same direction. However, other orientations of the field lines 155 of the electric field are also within the scope of the present disclosure.

In an exemplary embodiment, the electric field may be above about 2 nV/m, and the PEB may be performed at a temperature above about 22° C. However, other values for the electric field and the PEB temperature are also within the scope of the present disclosure. For example, the electric field may range between about 5 nV/m and about 20 nV/m, and/or the PEB temperature may range between about 25° C. and about 40° C., among other examples.

Although myriad means exist for establishing the electric field employed to develop the exposed portion 150 of the photoresist layer 130, one possible example may employ the feature 125. For example, the feature 125 may be a conductive feature which may be electrically biased to establish the electric field. Alternatively, or additionally, all or a portion of the substrate 105 may be electrically biased to establish the electric field, or a biasable electrode 160 may be appropriately located relative to the exposed portion 150.

Figure 3:
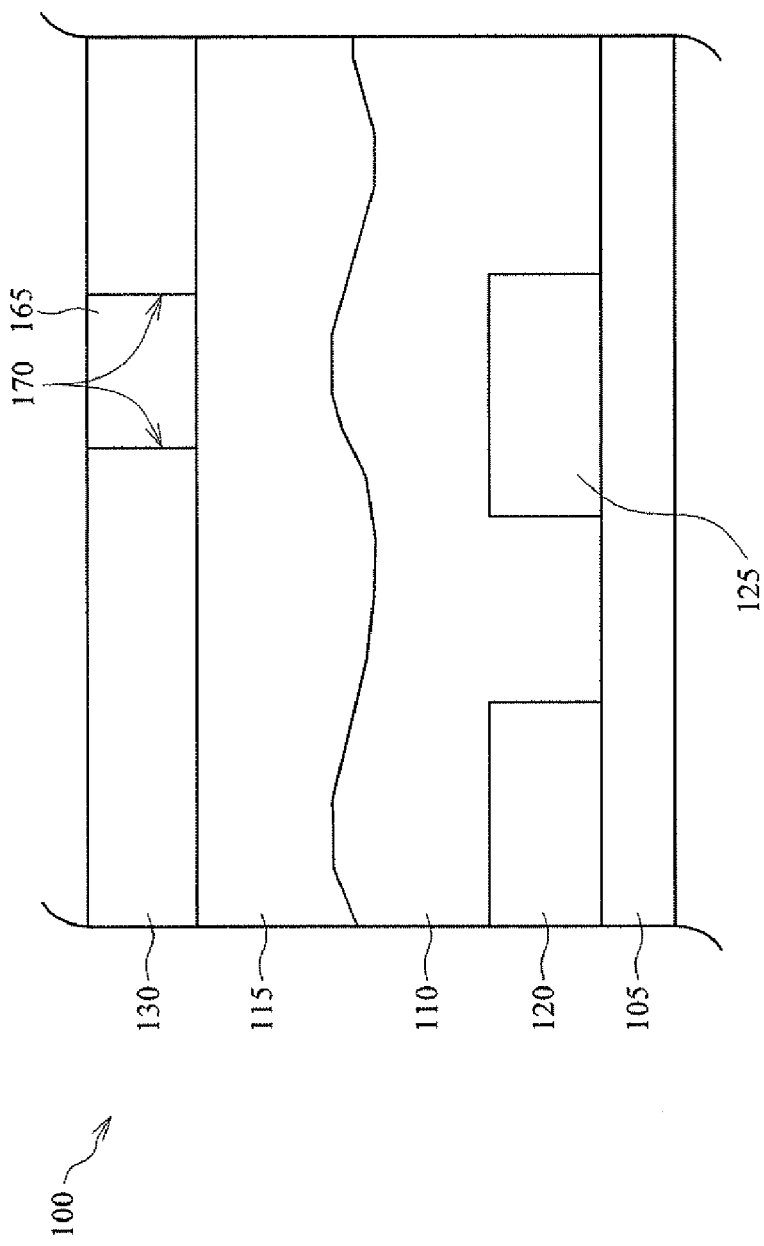
FIG. 3 is a sectional view of the apparatus shown in FIG. 2 in a subsequent stage of manufacture.

Referring to FIG. 3, illustrated is a sectional view of the apparatus 100 shown in FIG. 2 in a subsequent stage of manufacture after the PEB has been performed in the presence of the electric field, as described above. As a result of the PEB in the presence of the electric field, the exposed portion 150 has anisotropically grown into a larger exposed portion 165 which substantially spans the thickness of the photoresist layer 130. In one embodiment, sidewalls 170 of the exposed portion 165 may be substantially parallel. The sidewalls 170 may also be substantially perpendicular to the substrate 105.

Figure 4:
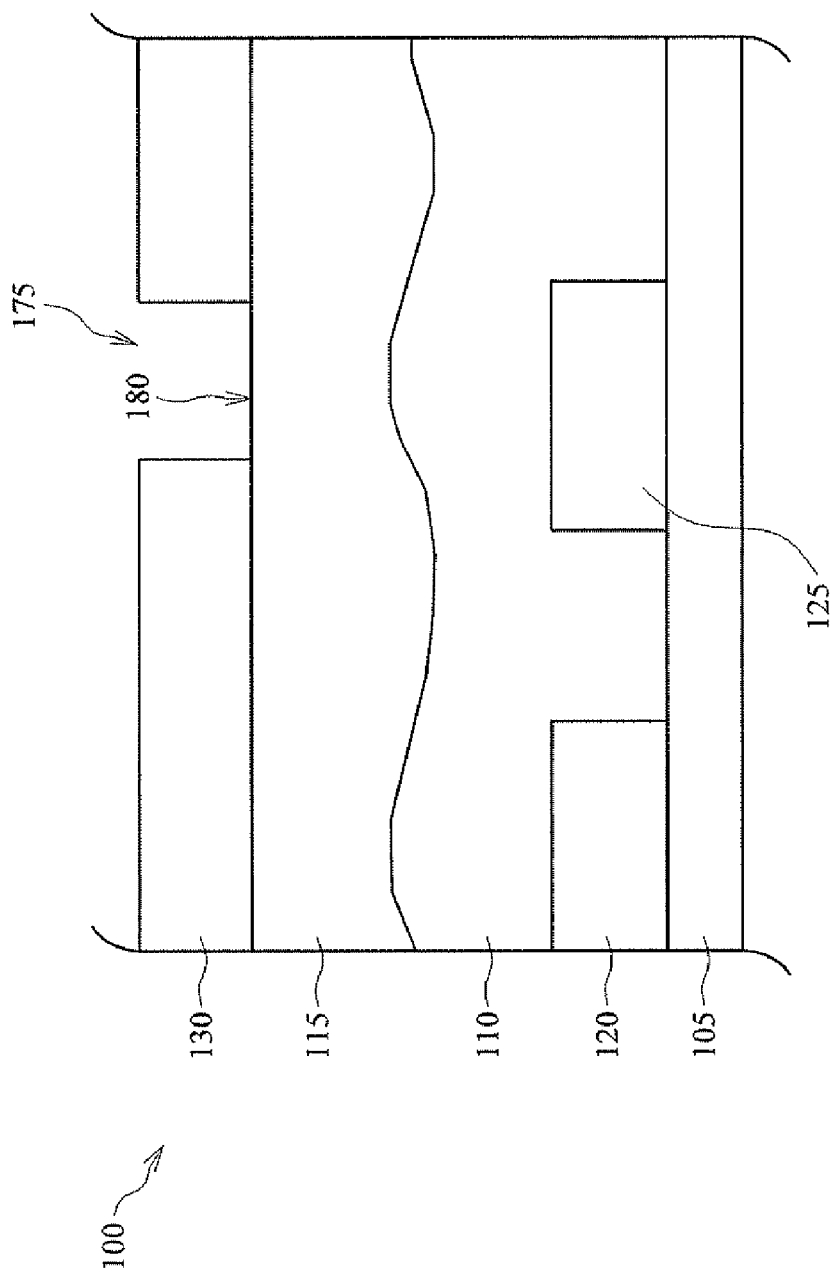
FIG. 4 is a sectional view of the apparatus shown in FIG. 3 in a subsequent stage of manufacture.

Referring to FIG. 4, illustrated is a sectional view of the apparatus 100 shown in FIG. 3 in a subsequent stage of manufacture after the patterned photoresist layer 130 is developed. A "positive" photoresist is depicted in the illustrated embodiment, such that the exposed portion 165 of the photoresist layer 130 is dissolved, leaving an opening 175 exposing a surface 180 of the underlying layer 115. However, other embodiments within the scope of the present disclosure may employ a "negative" photoresist, wherein substantially all of the photoresist layer 130 except for the exposed portion 165 is alternatively dissolved. In either scenario, a developer solution comprising KOH or NaOH may be employed to dissolve the exposed or unexposed portions of the photoresist layer 130.

Prior to developing, it may be necessary to ensure that bake temperatures (e.g., during the soft-bake and PEB) are kept sufficiently low as to not break down the photosensitive chemical in the photoresist layer 130. However, once the photoresist layer 130 is developed, a "hard-bake" at higher temperature and/or for longer duration may be performed. The hard-bake may be utilized to stabilize the photoresist layer 130, further reduce solvent concentrations, increase resistance to later-utilized etchants and ions, and/or to adjust selectivity, for example. In one embodiment, the hard-bake entails exposure to a temperature ranging between about 100° C. and about 130° C. for a duration ranging between about two minutes and about thirty minutes, depending on the heat treatment means (e.g., hot plate, oven, RTP, etc.). However, other embodiments are also within the scope of the present disclosure.

Figure 5:
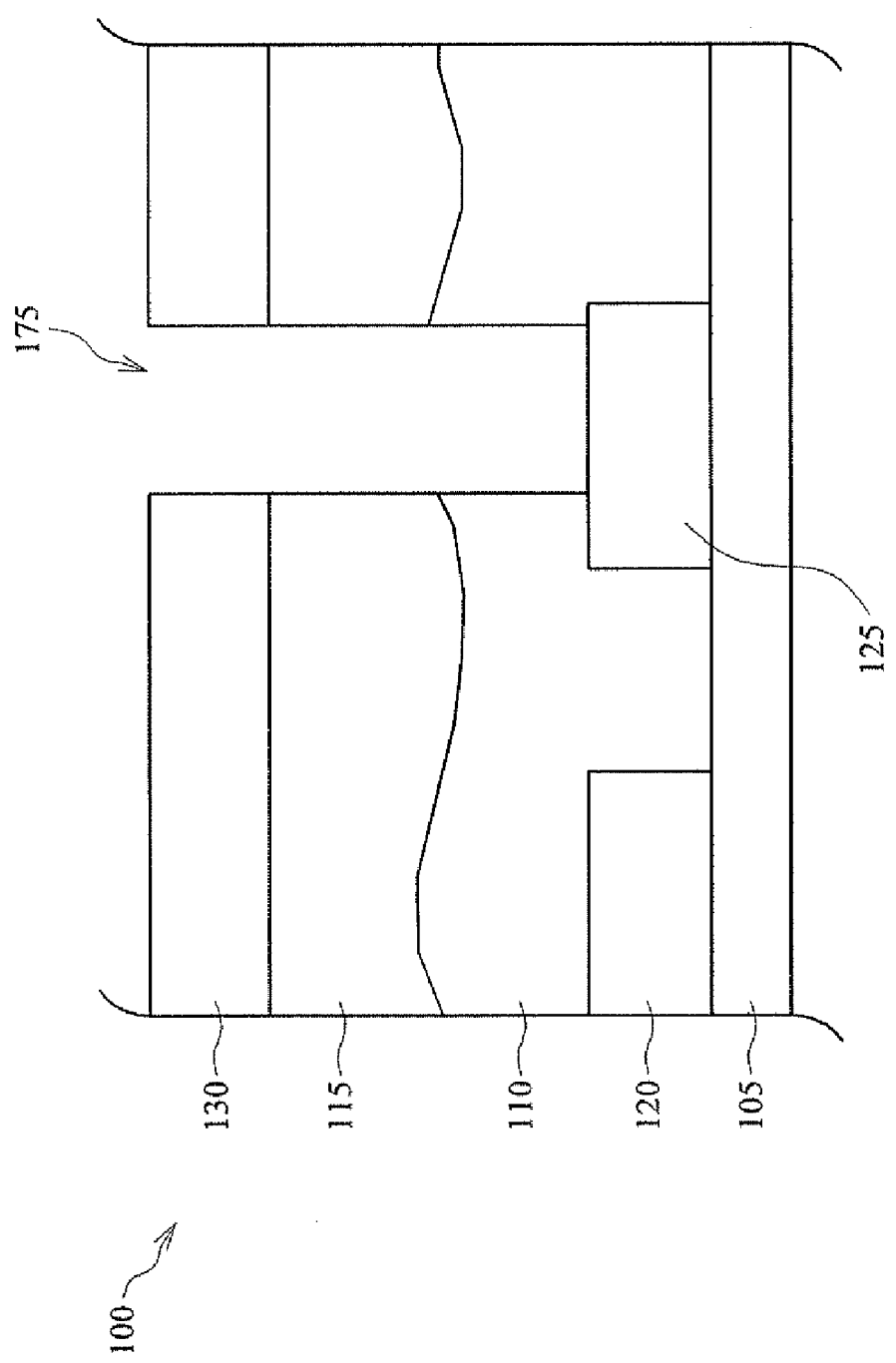
FIG. 5 is a sectional view of the apparatus shown in FIG. 4 in a subsequent stage of manufacture.

Referring to FIG. 5, illustrated is a sectional view of the apparatus 100 shown in FIG. 4 in a subsequent stage of manufacture in which the patterned photoresist layer 130 is employed for selective processing, such as to etch one or more underlying layers 110, 115 by one or more processes to which the pattern photoresist layer 130 is substantially resistant. Such etching processes may include wet or dry etching, whether conventional or future-developed, configured to extend the opening 175 into and/or through one or more layers 110, 115 underlying the patterned photoresist 130. Where multiple underlying layers 110, 115 are selectively processed in this manner, a single etching process may be employed to pattern each of the layers 110, 115, or separate processing may be employed for each individual layer.

Figure 6:
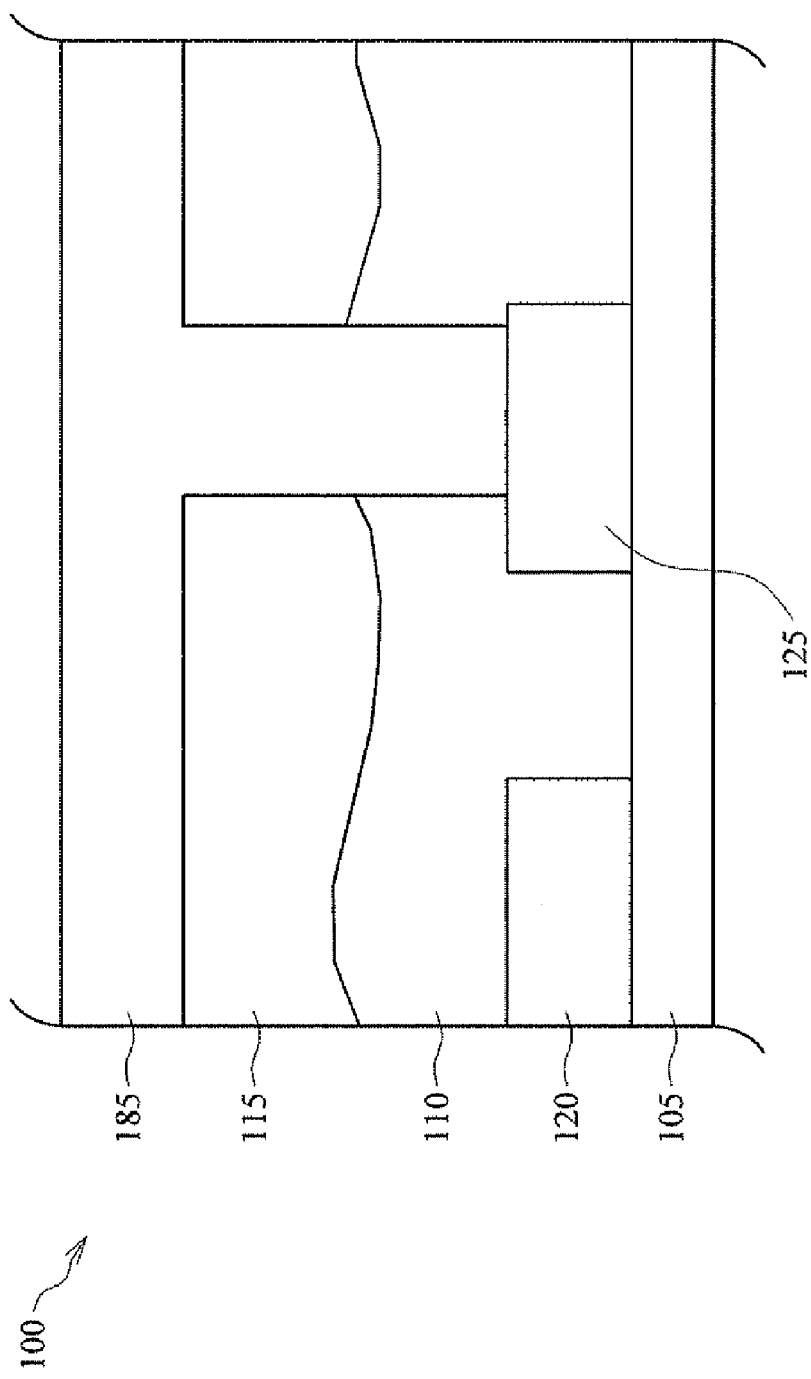
FIG. 6 is a sectional view of the apparatus shown in FIG. 5 in a subsequent stage of manufacture.

Referring to FIG. 6, illustrated is a sectional view of the apparatus 100 shown in FIG. 5 in a subsequent stage of manufacture in which the patterned photoresist layer 130 has been stripped away and an additional material layer 185 has been deposited in the extended opening 175 and on the layer 115. The patterned photoresist layer 130 may be stripped away by "wet" processing and/or "dry" processing. Such stripping processes may utilize an acetone, phenol-based, or other organic solution, an $H_2O_2$ or other oxidizing-type stripping component, or an oxide plasma. The layer 185 may be a conductive or a dielectric layer that is substantially similar in composition and manufacture to those examples provided above for the layers 110, 115, although the actual composition and manufacturing processing selected for the layer 185 are likely different from those selected for at least one of the layers 110, 115. The layer 185 may substantially fill the previously-formed opening 175, including to the extent that contact is made with the feature 125.

The stage of manufacture depicted in FIG. 6 may not represent a substantially completed stage of the apparatus 100. For example, additional processing may be performed, including without limitation the formation of additional layers of an interconnect structure, die cutting, and device packaging, among others.

Figure 7:
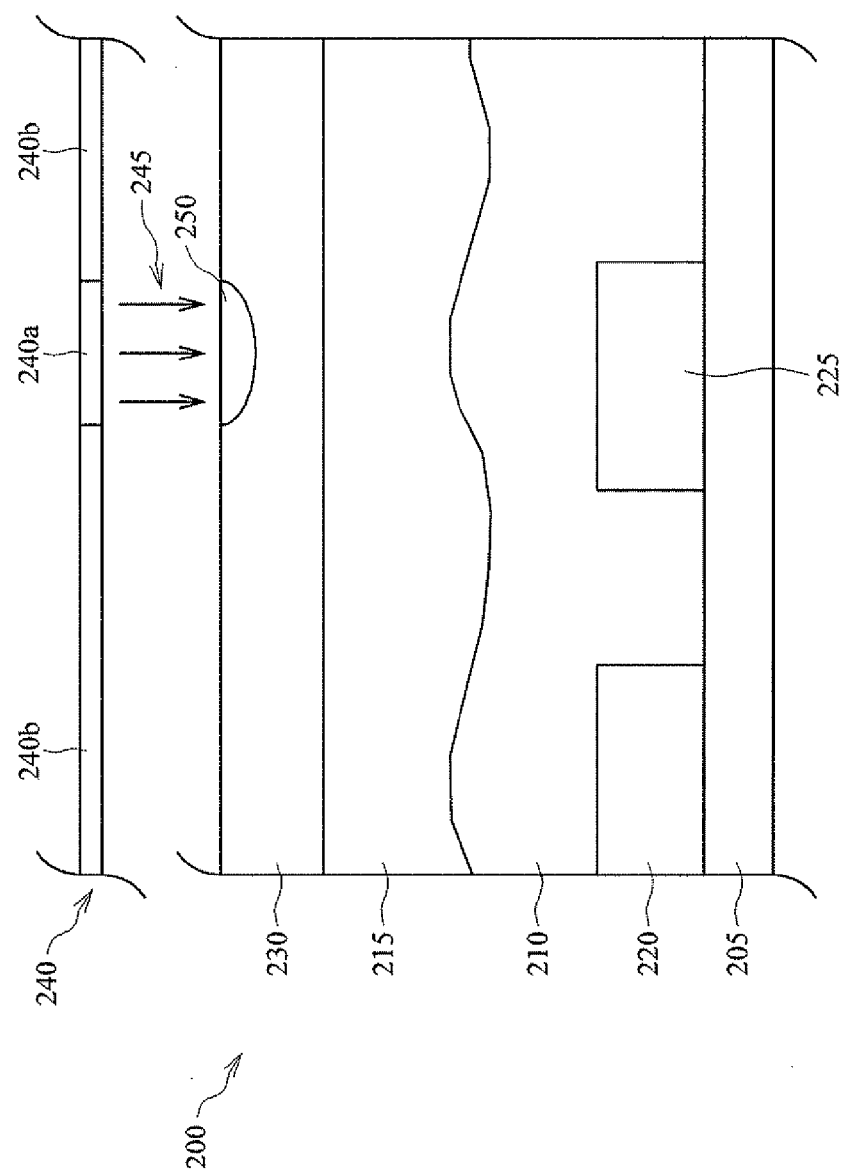
FIG. 7 is a sectional view of the apparatus shown in FIG. 6 in a subsequent stage of manufacture.

Referring to FIG. 7, illustrated is a section view of at least a portion of another embodiment of the apparatus 100 shown in FIG. 1, herein designated by reference numeral 200. The apparatus 200 may be substantially similar in composition and manufacture to the apparatus 100, except as described below. For example, the apparatus 200 includes a substrate 205, layers 210, 215, features 220, 225, and photoresist layer 230, one or more of which may be substantially similar in composition and manufacture to corresponding features shown in FIG. 1.

After initially forming the photoresist layer 230, the solvent therein may be driven off by employing one or more soft-bake or pre-exposure bake processes which may be substantially similar to those described above. A reticle 240 having a pattern defined by transparent portions 240a and opaque portions 240b is then employed to transfer the reticle pattern to the photoresist layer 230 by electromagnetic radiation 245 in a manner as also described above.

The exposure of the photoresist layer 230 is configured to chemically change one or more portions 250 of the photoresist layer 230, wherein each surface area of the portions 250 substantially conforms or otherwise corresponds to a transparent portion 240a of the reticle 240. As shown in FIG. 7, the chemically-reacted portions 250 of the photoresist layer 230 may not span the thickness of the photoresist layer 230.

Figure 8:
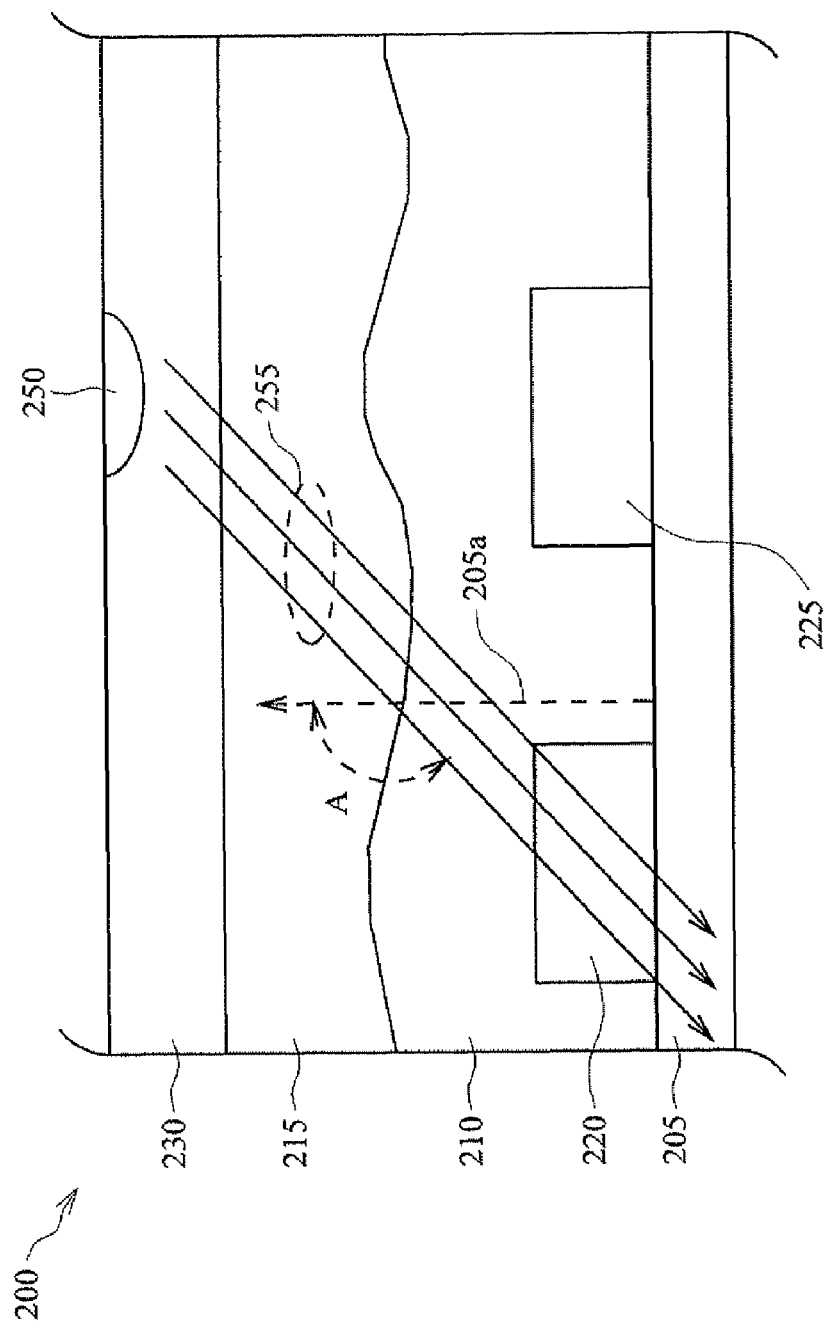
FIG. 8 is a sectional view of at least a portion of one embodiment of apparatus in an intermediate stage of manufacture according to aspects of the present disclosure.

Referring to FIG. 8, illustrated is a sectional view of the apparatus 200 shown in FIG. 7 in a subsequent stage of manufacture, during which a PEB is employed in the presence of an electric field, which is depicted in FIG. 8 by field lines 255. The field lines 255 of the electric field are oriented such that the exposed portions 250 are driven into the photoresist layer 230 substantially anisotropically at an obtuse angle A relative to a normal 205a of the substrate 205. For example, the field lines 255 in the embodiment depicted in FIG. 8 are oriented an about 135° relative to the normal 205a of the substrate 205, such that the exposed portions 250 are anisotropically developed in substantially the same direction. However, other orientations of the field lines 255 of the electric field are also within the scope of the present disclosure.

Figure 9:
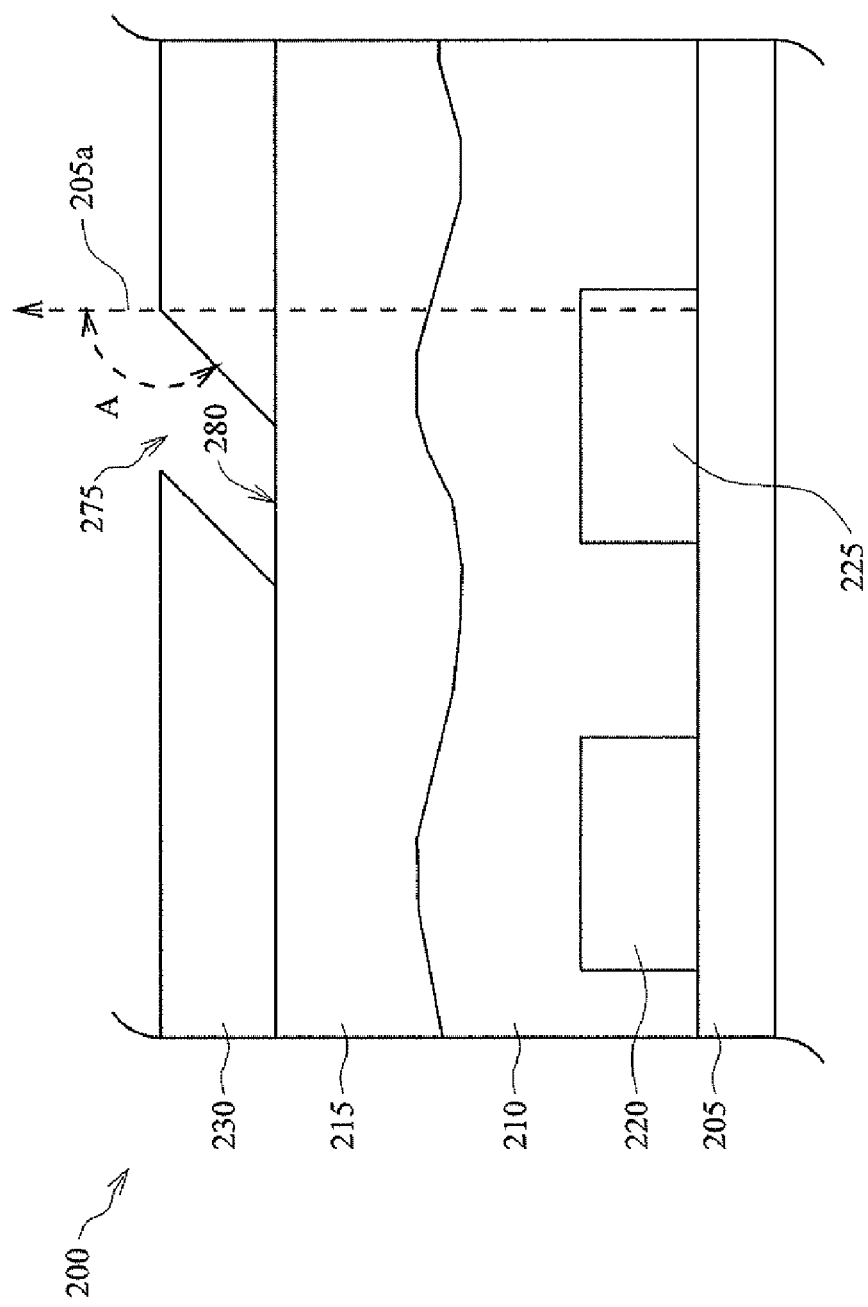
FIG. 9 is a sectional view of the apparatus shown in FIG. 8 in a subsequent stage of manufacture.

Referring to FIG. 9, illustrated is a sectional view of the apparatus 200 shown in FIG. 8 in a subsequent stage of manufacture after the PEB has been performed in the presence of the electric field, as described above. As a result of the PEB in the presence of the electric field, the exposed portions 250 have anisotropically grown into larger exposed portions 265 which substantially span the thickness of the photoresist layer 230.

FIG. 9 also depicts the removal of the portions 260 of the photoresist layer 230 by development, leaving openings 275 exposing a surface 280 of the underlying layer 215. However, while sidewalls of the openings 275 may be substantially parallel, the sidewalls may not be substantially perpendicular to the substrate 205. In contrast, the sidewalls of the openings 275 are substantially oriented at angle A described above, relative to the normal 205a of the substrate 205. Once the photoresist layer 230 is developed, a hard-bake may be performed in a manner similar to as described above.

Figure 10:
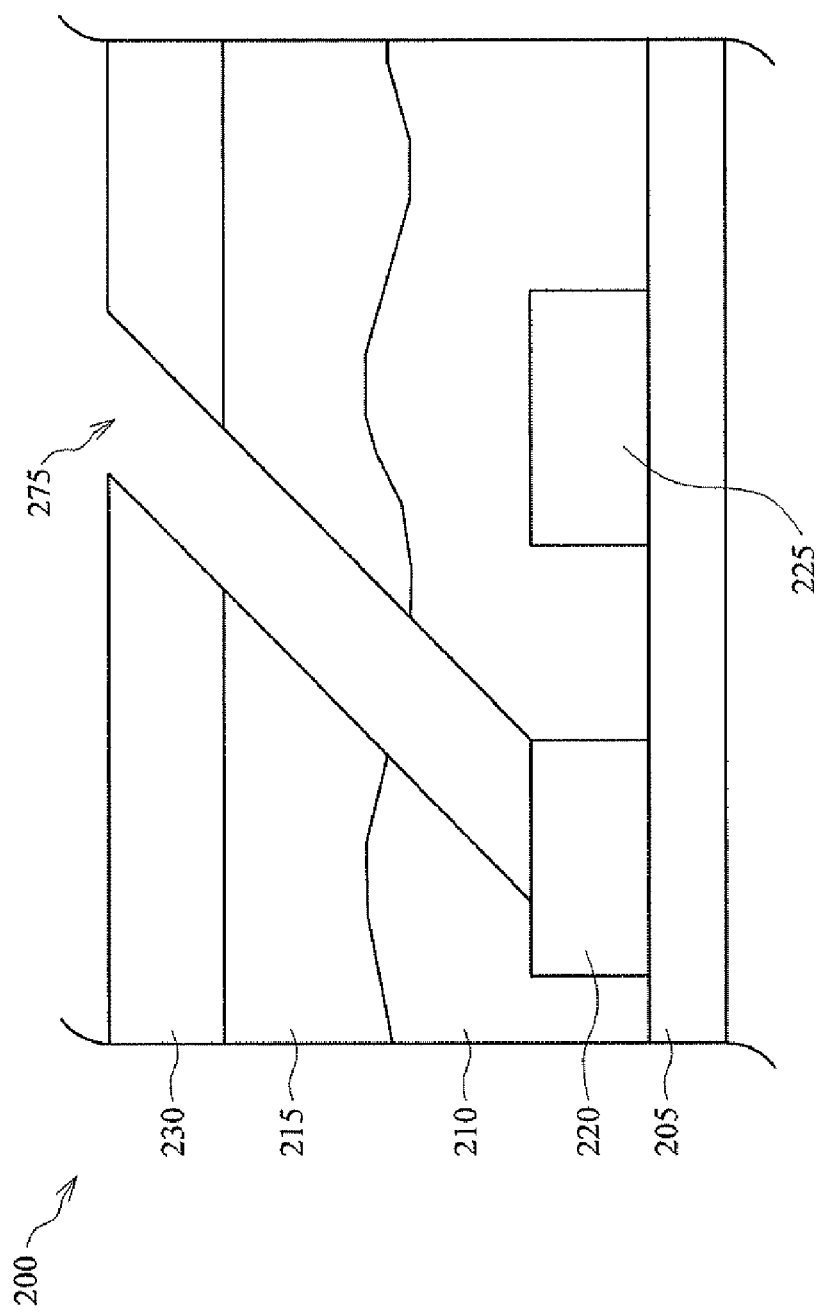
FIG. 10 is a sectional view of the apparatus shown in FIG. 9 in a subsequent stage of manufacture.

Referring to FIG. 10, illustrated is a sectional view of the apparatus 200 shown in FIG. 9 in a subsequent stage of manufacture in which the patterned photoresist layer 230 is employed for selective processing, such as to etch one or more underlying layers 210, 215 by one or more processes to which the pattern photoresist layer 230 is substantially resistant. Such etching processes may extend the opening 275 into and/or through one or more layers 210, 215 underlying the patterned photoresist 230. Where multiple underlying layers 210, 215 are selectively processed in this manner, a single etching process may be employed to pattern each of the layers 210, 215, or separate processing may be employed for each individual layer.

Figure 11:
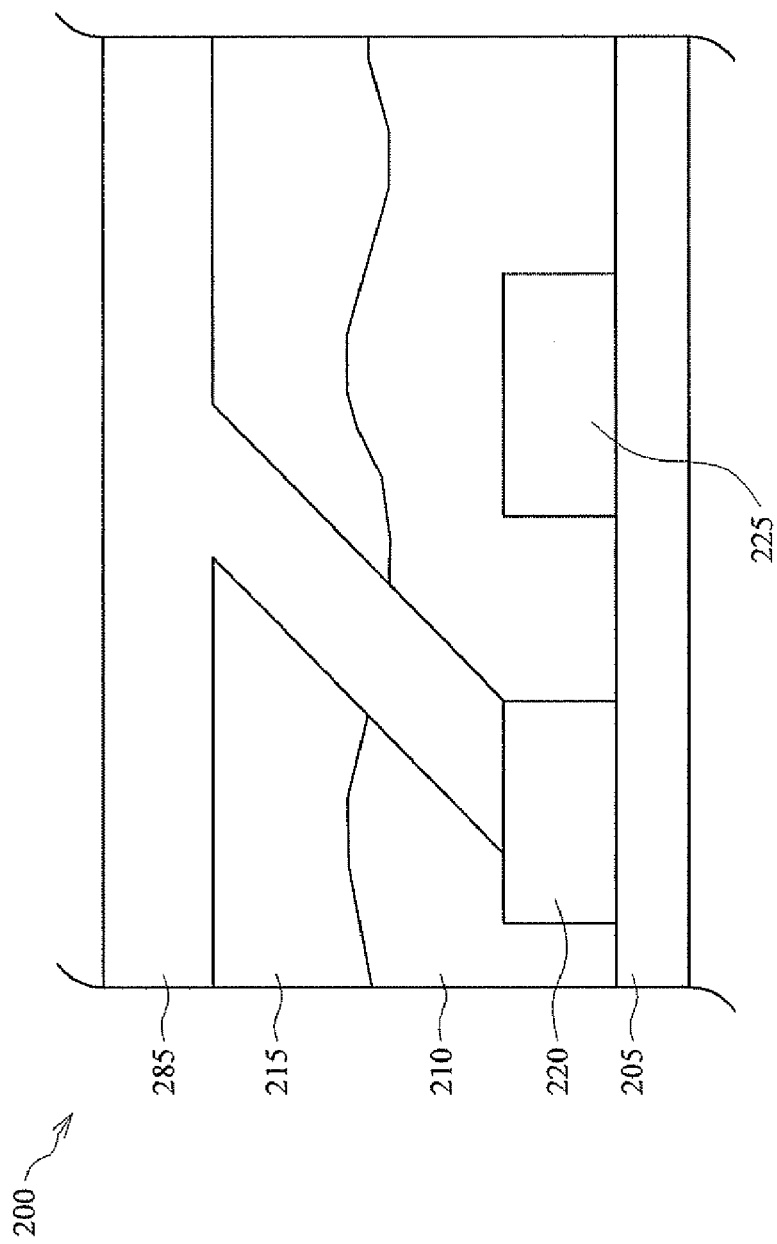
FIG. 11 is a sectional view of the apparatus shown in FIG. 10 in a subsequent stage of manufacture.

Referring to FIG. 11, illustrated is a sectional view of the apparatus 200 shown in FIG. 10 in a subsequent stage of manufacture in which the patterned photoresist layer 230 has been stripped away and an additional material layer 285 has been deposited in the extended opening 275 and on the layer 215. The patterned photoresist layer 230 may be stripped away by one or more stripping processes described above. The layer 285 may be substantially similar in composition and manufacture to the layer 185 described above. The layer 285 may substantially fill the previously-formed opening 275, including to the extent that contact is made with the feature 220.

The stage of manufacture depicted in FIG. 11 may not represent a substantially completed stage of the apparatus 200. For example, additional processing may be performed, including without limitation the formation of additional layers of an interconnect structure, die cutting, and device packaging, among others.

Figure 12:
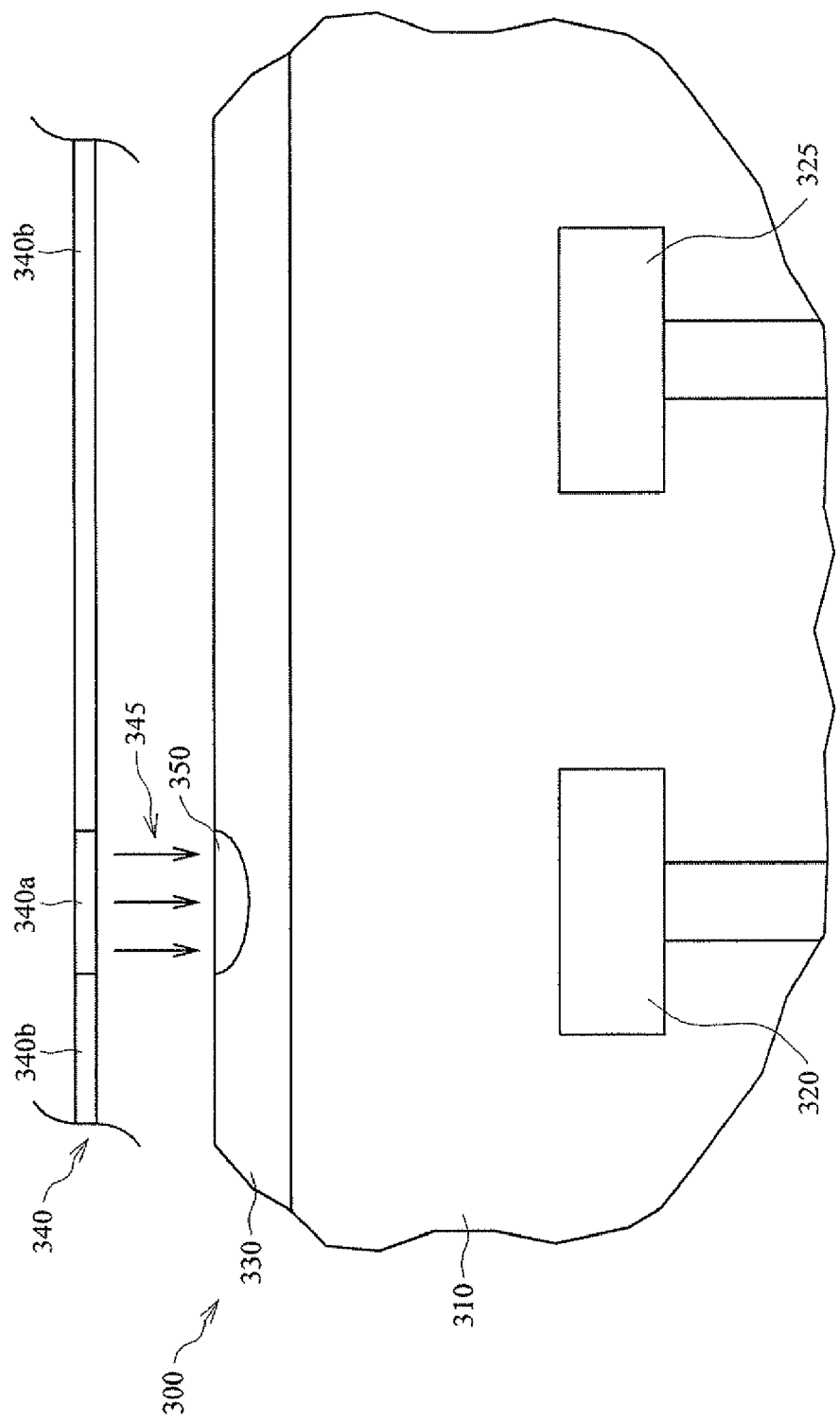
FIG. 12 is a sectional view of the apparatus shown in FIG. 11 in a subsequent stage of manufacture.

Referring to FIG. 12, illustrated is a section view of at least a portion of another embodiment of the apparatus 100 shown in FIG. 1, herein designated by reference numeral 300. The apparatus 300 may be substantially similar in composition and manufacture to the apparatus 300, except as described below. For example, the apparatus 300 includes a substrate (not shown), a layer 310, features 320, 325, and photoresist layer 330, one or more of which may be substantially similar in composition and manufacture to corresponding features shown in FIG. 1.

After initially forming the photoresist layer 330, the solvent therein may be driven off by employing one or more soft-bake or pre-exposure bake processes which may be substantially similar to those described above. A reticle 340 having a pattern defined by transparent portions 340a and opaque portions 340b is then employed to transfer the reticle pattern to the photoresist layer 330 by electromagnetic radiation 345 in a manner as also described above.

The exposure of the photoresist layer 330 is configured to chemically change one or more portions 350 of the photoresist layer 330, wherein each surface area of the portions 350 substantially conforms or otherwise corresponds to a transparent portion 340a of the reticle 340. As shown in FIG. 12, the chemically-reacted portions 350 of the photoresist layer 330 may not span the thickness of the photoresist layer 330.

Figure 13:
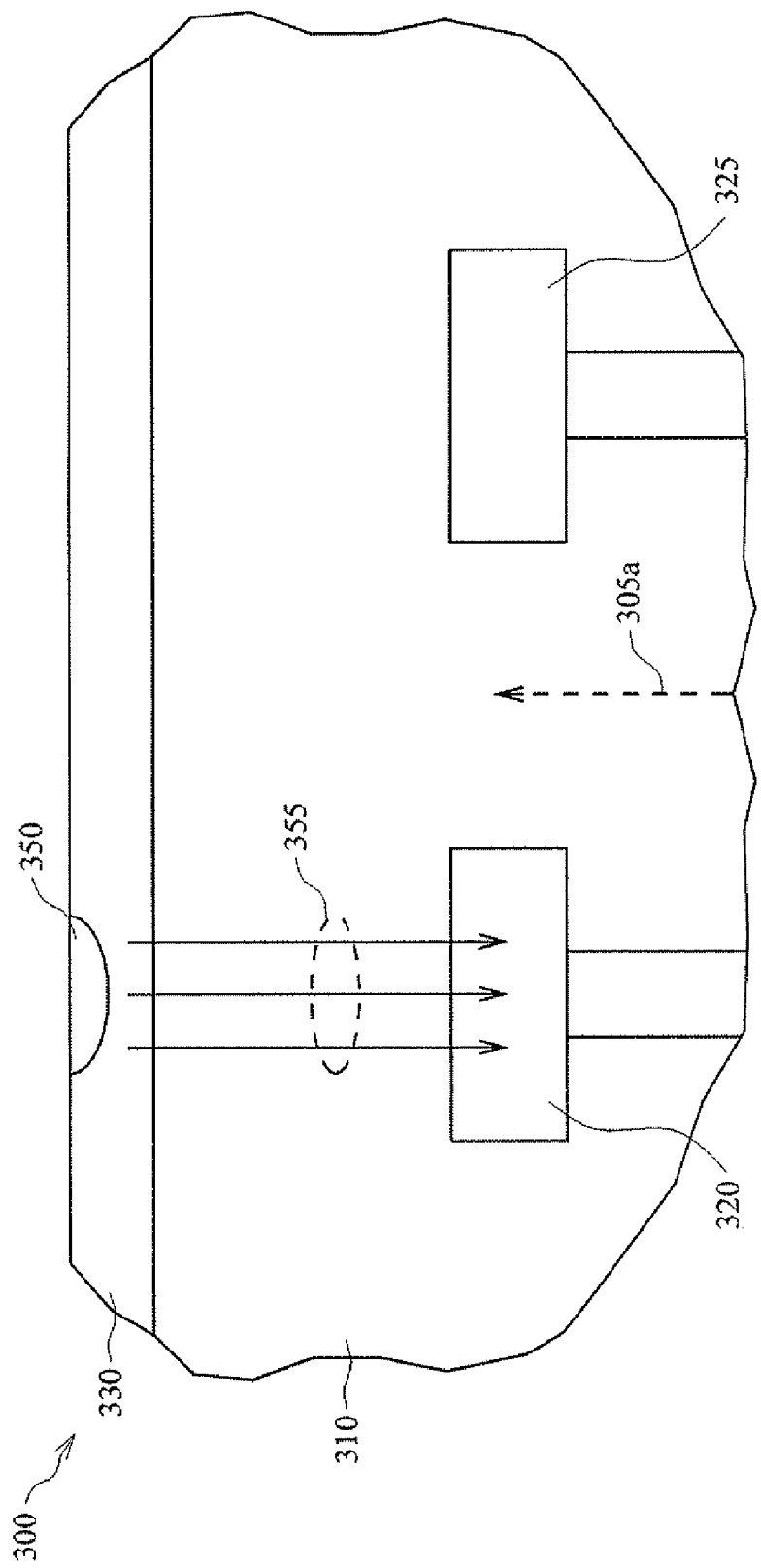
FIG. 13 is a sectional view of at least a portion of one embodiment of apparatus in an intermediate stage of manufacture according to aspects of the present disclosure.

Referring to FIG. 13, illustrated is a sectional view of the apparatus 300 shown in FIG. 12 in a subsequent stage of manufacture, during which a PEB is employed in the presence of an electric field, which is depicted in FIG. 13 by field lines 355. The field lines 355 of the electric field are oriented such that the exposed portions 350 are driven into the photoresist layer 330 substantially anisotropically in a direction that is substantially non-parallel to a normal 305a of the substrate 305. However, other orientations of the field lines 355 of the electric field are also within the scope of the present disclosure.

Figure 14:
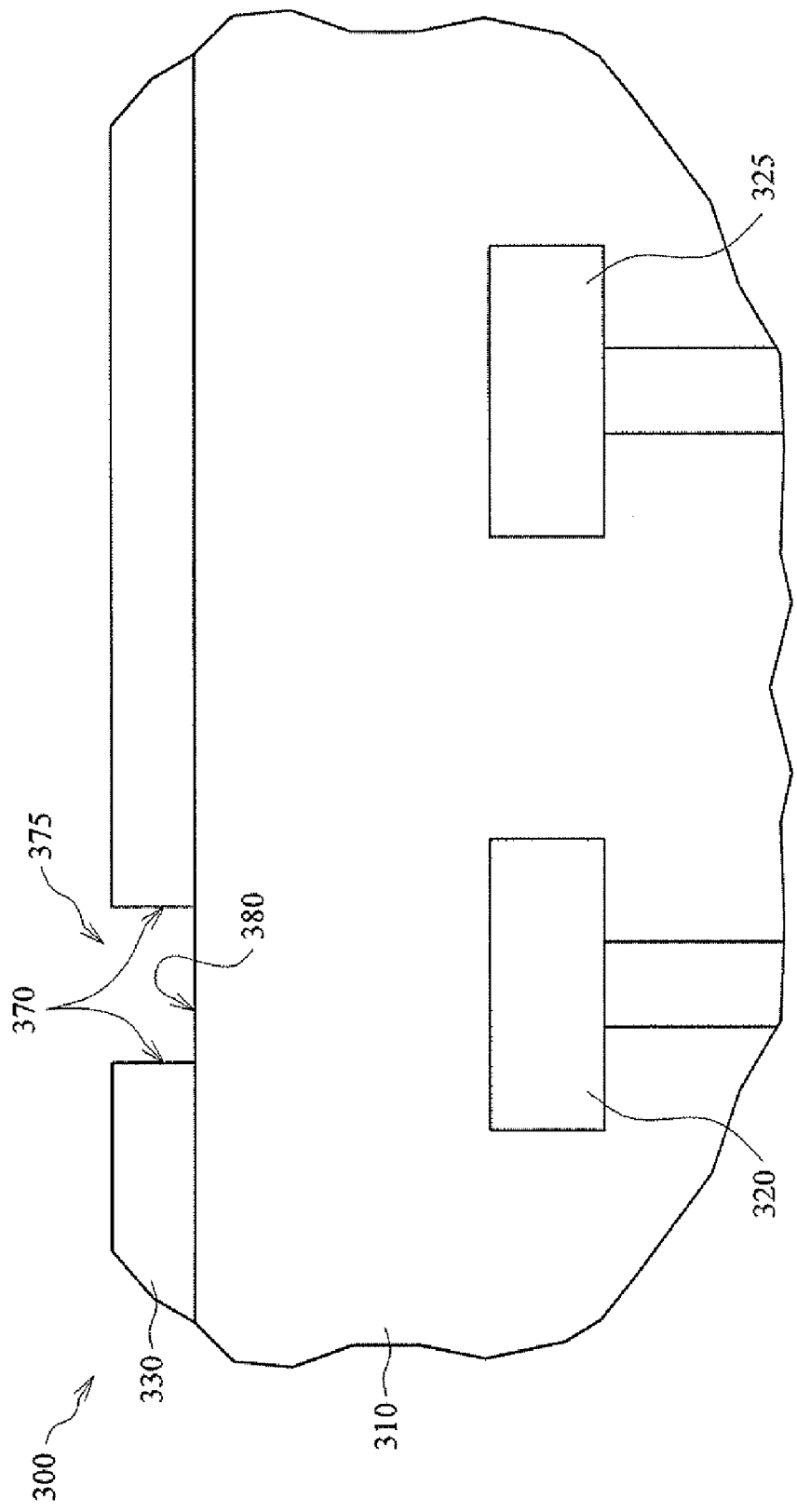
FIG. 14 is a sectional view of the apparatus shown in FIG. 13 in a subsequent stage of manufacture.

Referring to FIG. 14, illustrated is a sectional view of the apparatus 300 shown in FIG. 13 in a subsequent stage of manufacture after the PEB has been performed in the presence of the electric field, as described above. As a result of the PEB in the presence of the electric field, the exposed portions 350 can anisotropically grow into larger exposed portions which substantially span the thickness of the photoresist layer 330. However, in the stage of manufacture illustrated in FIG. 14, the larger exposed portions of the photoresist layer 330 have been remove by development, leaving openings 375 exposing a surface 380 of the underlying layer 310. Sidewalls 370 of the openings 375 may be substantially parallel, and may also be substantially perpendicular to the substrate 305. Once the photoresist layer 330 is developed, a hard-bake may also be performed in a manner similar to as described above.

Figure 15:
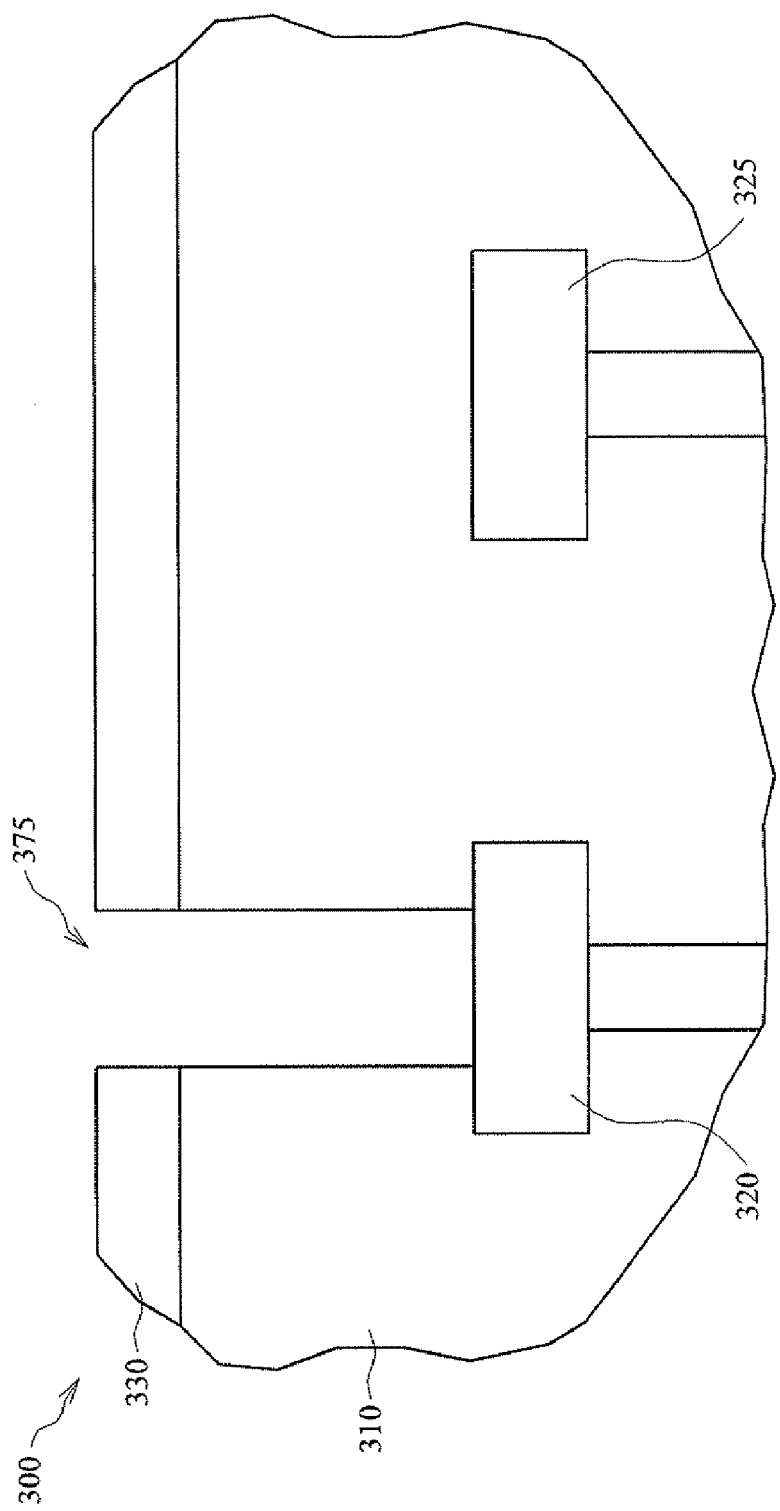
FIG. 15 is a sectional view of the apparatus shown in FIG. 14 in a subsequent stage of manufacture.

Referring to FIG. 15, illustrated is a sectional view of the apparatus 300 shown in FIG. 14 in a subsequent stage of manufacture in which the patterned photoresist layer 330 is employed for selective processing, such as to etch one or more underlying layers 310 by one or more processes to which the pattern photoresist layer 330 is substantially resistant. Such etching processes may extend the openings 375 into and/or through one or more layers 310 underlying the patterned photoresist 330. Where multiple underlying layers 310 are selectively processed in this manner, a single etching process may be employed to pattern each of the layers 310, or separate processing may be employed for each individual layer.

Figure 16:
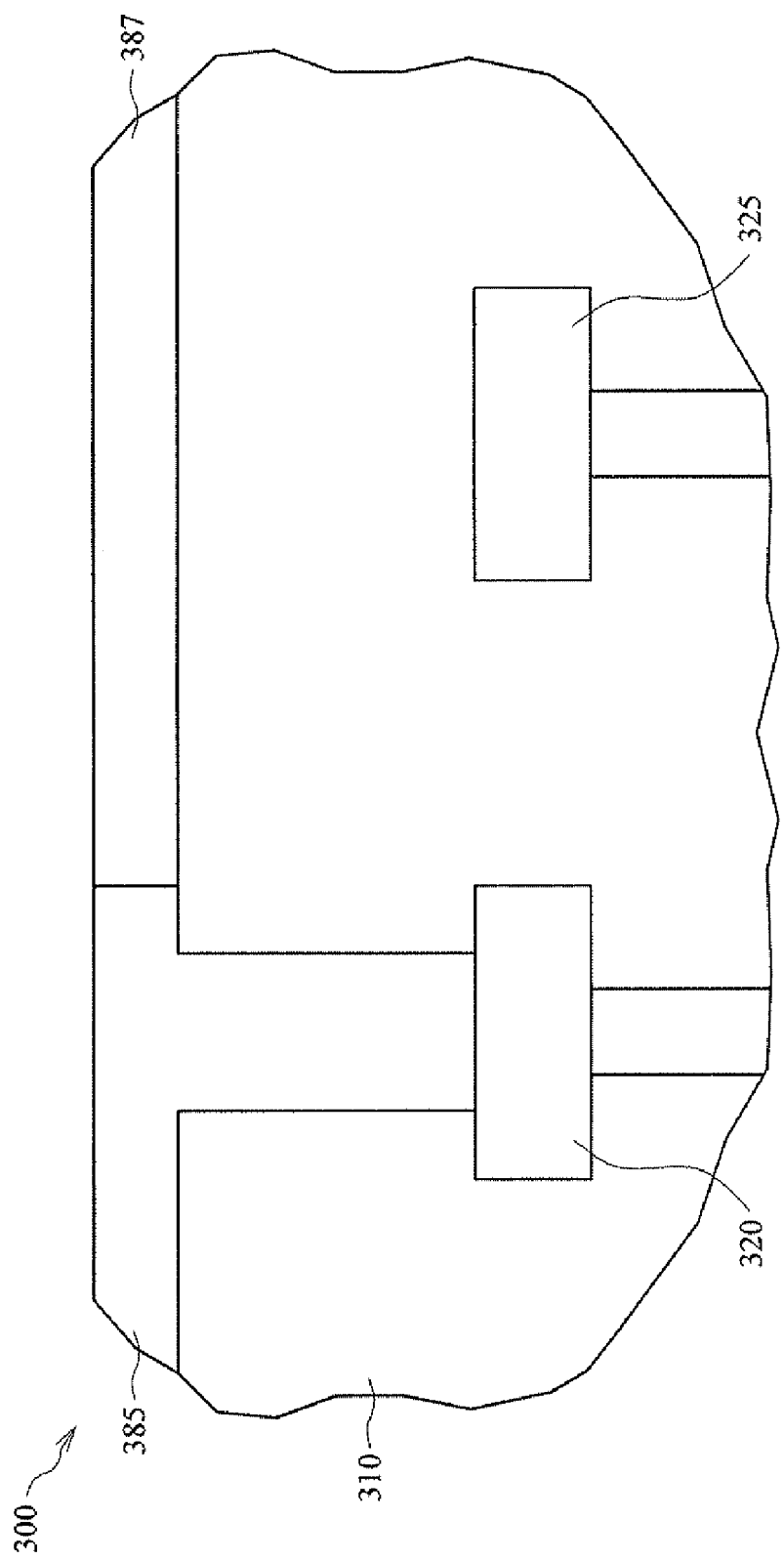
FIG. 16 is a sectional view of the apparatus shown in FIG. 15 in a subsequent stage of manufacture.

Referring to FIG. 16, illustrated is a sectional view of the apparatus 300 shown in FIG. 15 in a subsequent stage of manufacture in which the patterned photoresist layer 330 has been stripped away and an additional material layer 385 has been deposited in the extended opening 375 and on the layer 310. The patterned photoresist layer 330 may be stripped away by one or more stripping processes described above. The layer 385 may be substantially similar in composition and manufacture to the layer 185 described above. The layer 385 may substantially fill the previously-formed opening 375, including to the extent that contact is made with the feature 320. In one embodiment, the layer 385 may be a conductive layer, such as may be employed in an interconnect structure. An insulating layer 387 comprising a dielectric material described above may also be formed adjacent the layer 385, such as to electrically isolate the layer 385 from other proximate conductive features.

Figure 17:
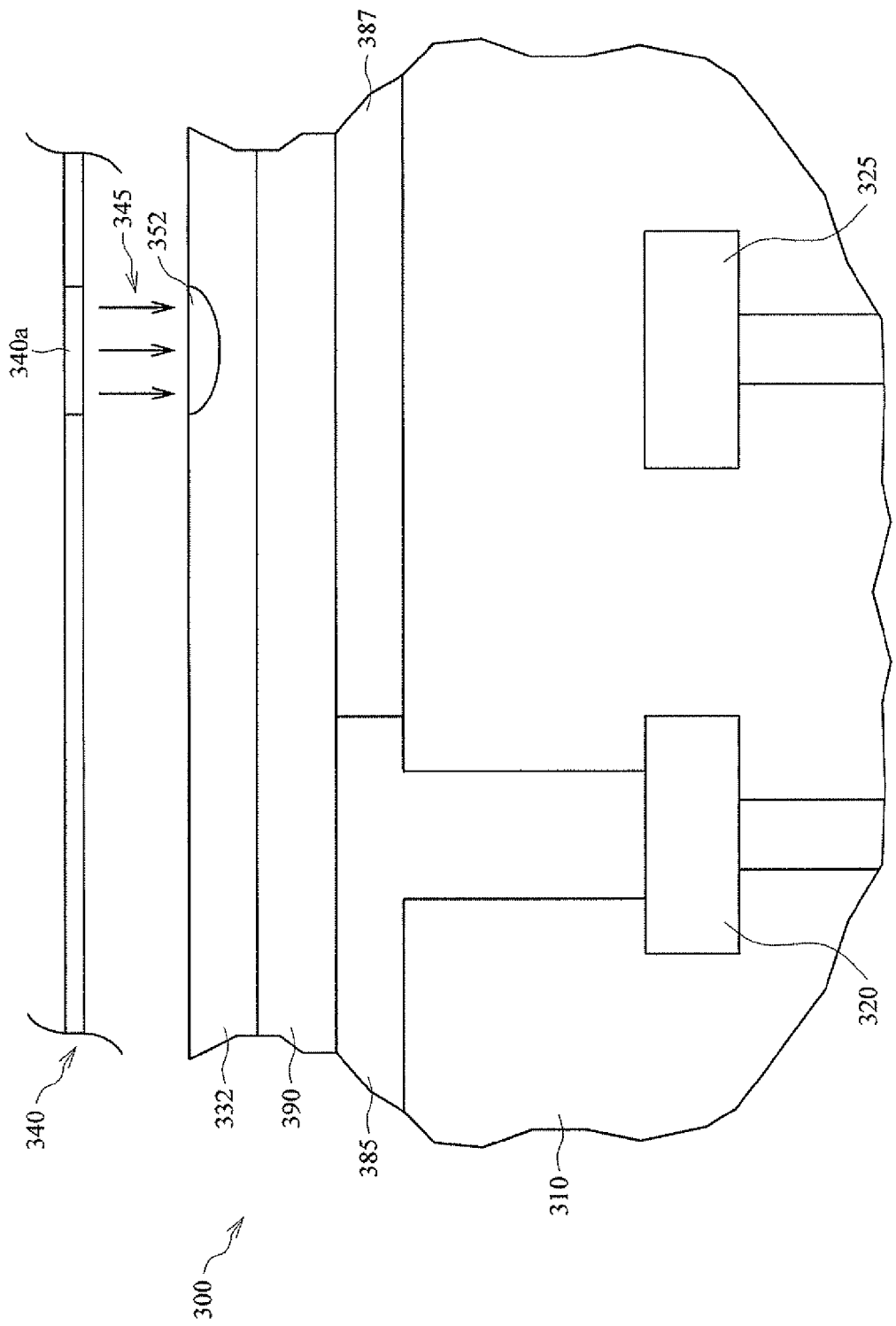
FIG. 17 is a sectional view of the apparatus shown in FIG. 16 in a subsequent stage of manufacture.

Referring to FIG. 17, illustrated is a section view of the apparatus 300 shown in FIG. 16 in a subsequent stage of manufacture, during which an additional reticle pattern is transferred to an additional photoresist layer 332 by electromagnetic radiation 345 in a manner as described above. The reticle pattern depicted as being transferred in FIG. 17 may be substantially similar to the pattern that is depicted as being transferred in FIG. 12, such as corresponding to the transparent portion 340a of the reticle 340, although another pattern may alternatively or additionally be employed. The photoresist layer 332 may be substantially similar in composition and manufacture to the photoresist layer 330 described above, and may be formed on the layers 385, 387 described above, although in the embodiment illustrated in FIG. 17 the photoresist layer 332 is formed on a layer 390 which may represent one or more insulating or conductive layers formed on the layers 385, 387.

The exposure of the photoresist layer 332 is configured to chemically change one or more portions 352 of the photoresist layer 332, wherein each surface area of the portions 352 substantially conforms or otherwise corresponds to a transparent portion 340a of the reticle 340. As shown in FIG. 17, the chemically-reacted portions 352 of the photoresist layer 332 may not span the thickness of the photoresist layer 332.

Figure 18:
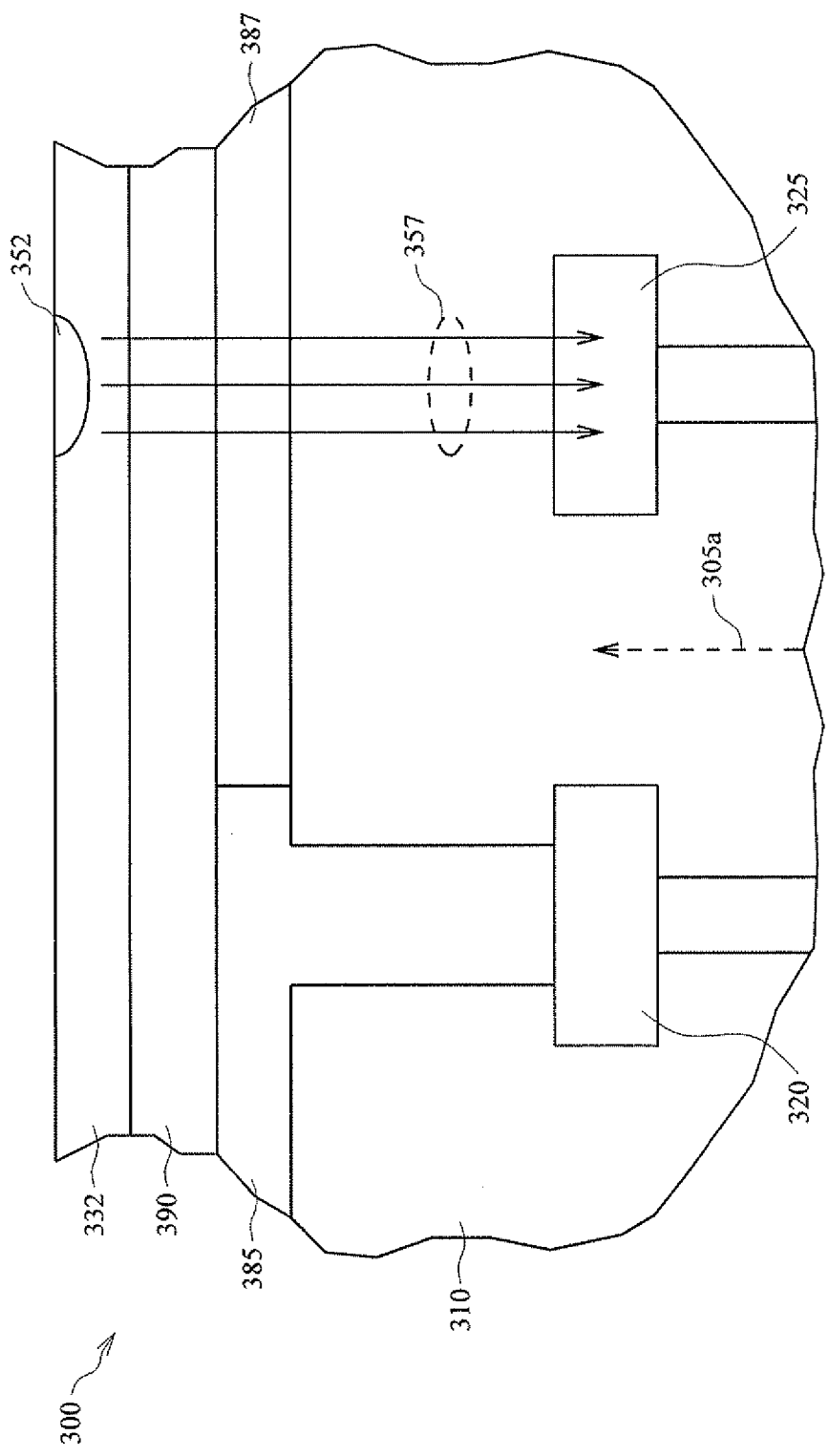
FIG. 18 is a sectional view of at least a portion of one embodiment of apparatus in an intermediate stage of manufacture according to aspects of the present disclosure.

Referring to FIG. 18, illustrated is a sectional view of the apparatus 300 shown in FIG. 17 in a subsequent stage of manufacture, during which a PEB is employed in the presence of an electric field, which is depicted in FIG. 18 by field lines 357. The field lines 357 of the electric field are oriented such that the exposed portions 352 are driven into the photoresist layer 332 substantially anisotropically in a direction that is substantially non-parallel to a normal 305a of the substrate 305. However, other orientations of the field lines 357 of the electric field are also within the scope of the present disclosure.

Figure 19:
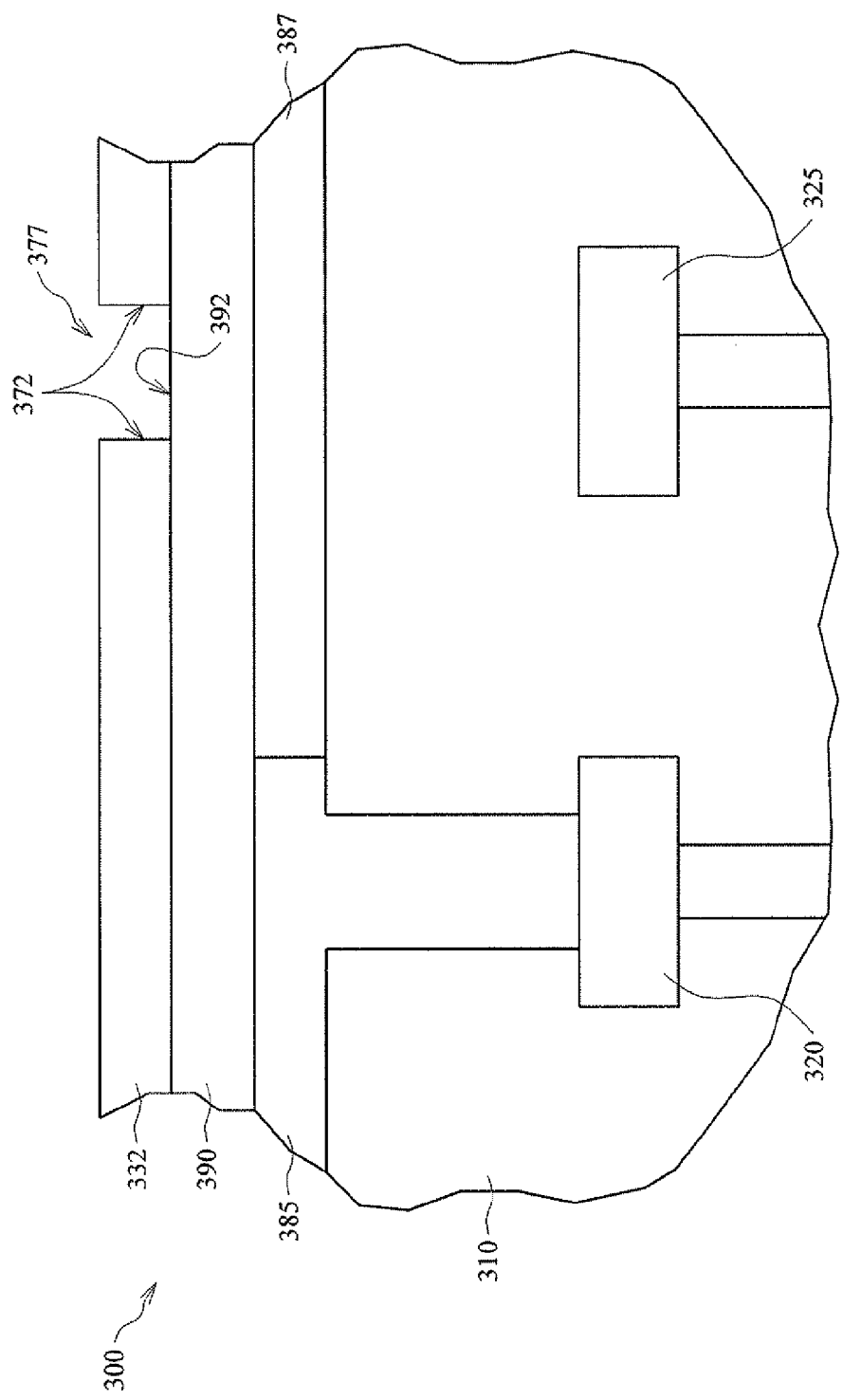
FIG. 19 is a sectional view of the apparatus shown in FIG. 18 in a subsequent stage of manufacture.

Referring to FIG. 19, illustrated is a sectional view of the apparatus 300 shown in FIG. 18 in a subsequent stage of manufacture after the PEB has been performed in the presence of the electric field, as described above. As a result of the PEB in the presence of the electric field, the exposed portions 352 can anisotropically grow into larger exposed portions which substantially span the thickness of the photoresist layer 332. In the stage of manufacture illustrate in FIG. 19, these portions of the photoresist layer 332 have been removed, leaving openings 377 exposing a surface 392 of the underlying layer 390. Sidewalls 372 of the openings 377 may be substantially parallel, and may also be substantially perpendicular to the substrate 305. Once the photoresist layer 332 is developed, a hard-bake may also be performed in a manner similar to as described above.

Figure 20:
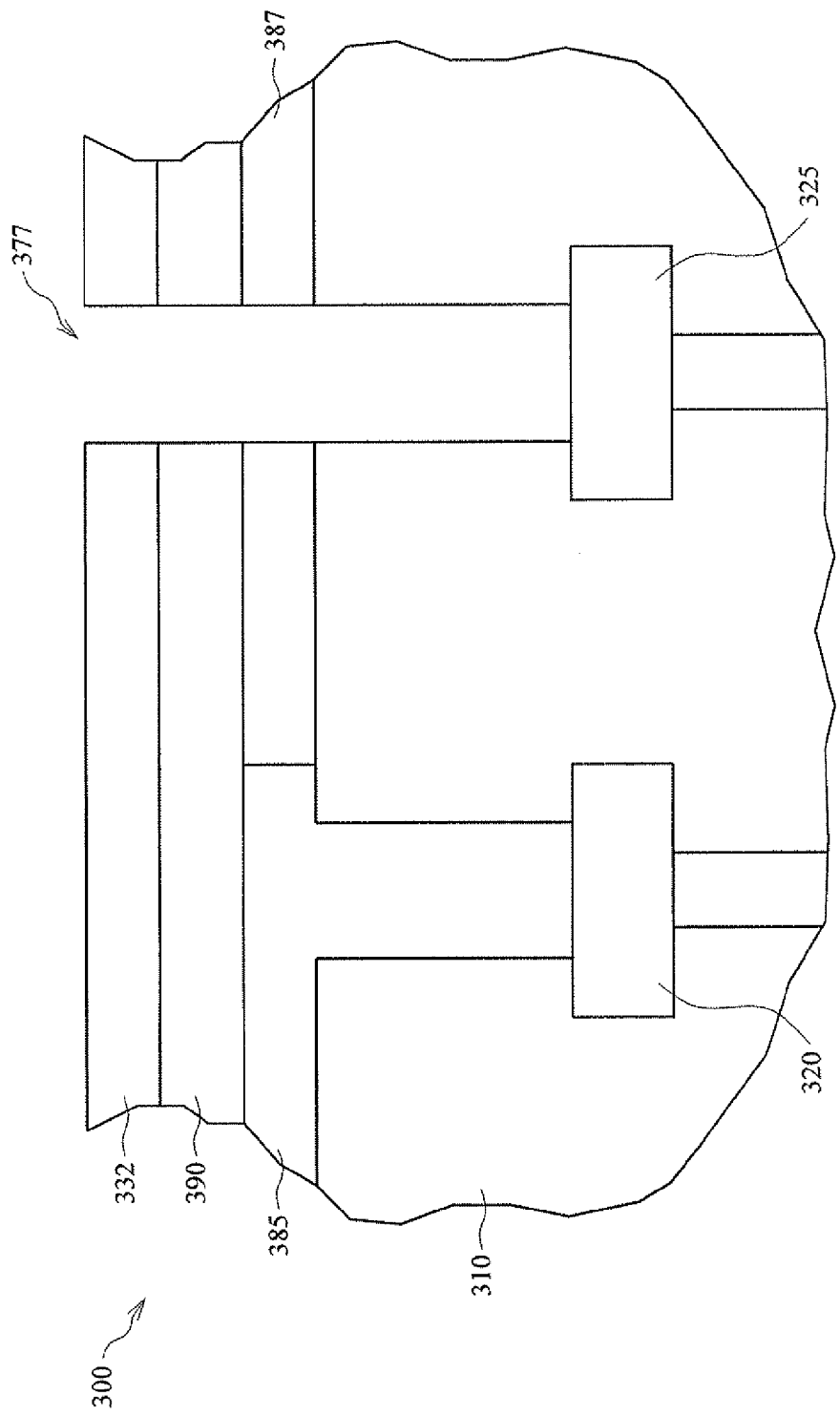
FIG. 20 is a sectional view of the apparatus shown in FIG. 19 in a subsequent stage of manufacture.

Referring to FIG. 20, illustrated is a sectional view of the apparatus 300 shown in FIG. 19 in a subsequent stage of manufacture in which the patterned photoresist layer 332 is employed for selective processing, such as to etch one or more underlying layers 390 by one or more processes to which the pattern photoresist layer 332 is substantially resistant. Such etching processes may extend the openings 377 into and/or through one or more layers 390 underlying the patterned photoresist 332. Where multiple underlying layers 390 are selectively processed in this manner, a single etching process may be employed to pattern each of the layers 390, or separate processing may be employed for each individual layer.

Figure 21:
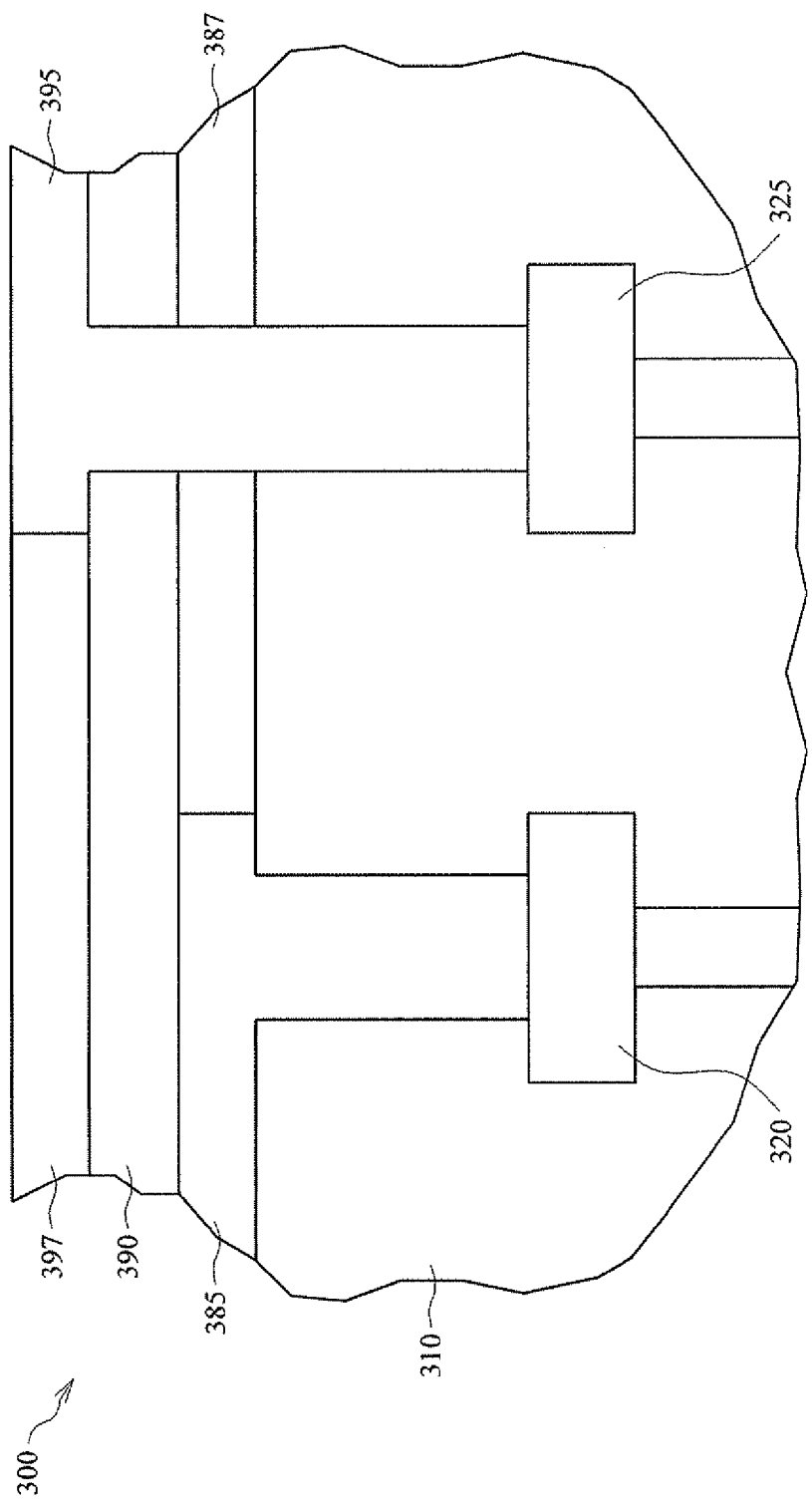
FIG. 21 is a sectional view of the apparatus shown in FIG. 20 in a subsequent stage of manufacture.

Referring to FIG. 21, illustrated is a sectional view of the apparatus 300 shown in FIG. 20 in a subsequent stage of manufacture in which the patterned photoresist layer 332 has been stripped away and an additional material layer 395 has been deposited in the extended opening 377 and on the layer 390. The patterned photoresist layer 332 may be stripped away by one or more stripping processes described above. The layer 395 may be substantially similar in composition and manufacture to the layer 185 described above. The layer 395 may substantially fill the previously-formed opening 377, including to the extent that contact is made with the feature 325. In one embodiment, the layer 395 may be a conductive layer, such as may be employed in an interconnect structure. An insulating layer 397 comprising a dielectric material described above may also be formed adjacent the layer 395, such as to electrically isolate the layer 395 from other proximate conductive features.

The stage of manufacture depicted in FIG. 21 may not represent a substantially completed stage of the apparatus 300. For example, additional processing may be performed, including without limitation the formation of additional layers of an interconnect structure, die cutting, and device packaging, among others.

In view of the above, it should be apparatus that the present disclosure introduces methods for photolithography processing which, at least in one embodiment, includes depositing a photoresist layer on a surface of a substrate, exposing a portion of the photoresist layer to electromagnetic radiation, and treating the photoresist layer with thermal energy while subjecting the exposed photoresist layer portion to an electric field. In such embodiments, the electric field can be configured to substantially limit diffusion of the exposed photoresist layer portion to anisotropic diffusion.

Another method introduced in the present disclosure includes depositing a first photoresist layer on a first material layer, exposing a portion of the first photoresist layer to first electromagnetic radiation, and treating the first photoresist layer with thermal energy while subjecting the exposed portion of the first photoresist layer to a first electric field, wherein the first electric field is configured to substantially limit diffusion of the exposed portion of the first photoresist layer to anisotropic diffusion. The thermally-treated, exposed portion of the first photoresist layer is then removed, and the first photoresist layer is employed to form a first opening in the first material layer. The first photoresist layer is then removed, and a second material layer is deposited over the first material layer, including in the first opening. A third material layer is deposited over the second material layer, and a second photoresist layer is deposited on the third material layer. A portion of the second photoresist layer is exposed to second electromagnetic radiation, and the second photoresist layer is treated with thermal energy while subjecting the exposed portion of the second photoresist layer to a second electric field, wherein the second electric field is configured to substantially limit diffusion of the exposed portion of the second photoresist layer to anisotropic diffusion. The thermally-treated, exposed portion of the second photoresist layer is removed, and the second photoresist layer is employed to form a second opening in the third material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for photolithography processing, comprising:
depositing a photoresist layer on a surface of a substrate;
exposing a portion of the photoresist layer to electromagnetic radiation; and
treating the photoresist layer with thermal energy while subjecting the exposed photoresist layer portion to an electric field;
wherein the electric field is oriented such that charged particles of the exposed photoresist layer portion are driven into the photoresist layer substantially anisotropically and wherein electric field lines of the electric field that pass through the exposed photoresist layer portion are oriented at an obtuse angle relative to a normal of the substrate surface; wherein the obtuse angle is substantially non-parallel to the normal of the substrate surface.

2. The method of claim 1 wherein the electromagnetic radiation includes visible light.

3. The method of claim 1 wherein the electromagnetic radiation includes ultraviolet (UV) light.

4. The method of claim 1 wherein the electromagnetic radiation includes deep ultraviolet (DUV) light.

5. The method of claim 1 wherein the electromagnetic radiation includes extreme ultraviolet (EUV) light.

6. The method of claim 1 wherein, prior to treatment with thermal energy and being subjected to the electric field, the exposed photoresist layer portion has a first thickness that is substantially less than a second thickness of the photoresist layer.

7. The method of claim 6 wherein treating the photoresist layer with thermal energy while subjecting the exposed photoresist layer portion to the electric field increases the first thickness towards the second thickness without substantially increasing a width of the exposed photoresist layer portion.

8. The method of claim 1, wherein the obtuse angle is approximately 135 degrees.

9. A method for photolithography processing, comprising:
depositing a first photoresist layer on a first material layer;
exposing a portion of the first photoresist layer to first electromagnetic radiation;
treating the first photoresist layer with thermal energy while subjecting the exposed portion of the first photoresist layer to a first electric field, wherein the first electric field is oriented such that charged particles of the exposed photoresist layer portion are driven into the first photoresist layer substantially anisotropically and wherein first electric field lines of the first electric field are oriented at an obtuse angle relative to a normal of a surface of a substrate over which the first photoresist layer is disposed, wherein the obtuse angle is substantially non-parallel to the normal of the surface of the substrate;
removing the thermally-treated, exposed portion of the first photoresist layer;
employing the first photoresist layer to form a first opening in the first material layer;
removing the first photoresist layer;
depositing a second material layer over the first material layer, including in the first opening;
depositing a third material layer over the second material layer;
depositing a second photoresist layer on the third material layer;
exposing a portion of the second photoresist layer to second electromagnetic radiation;
treating the second photoresist layer with thermal energy while subjecting the exposed portion of the second photoresist layer to a second electric field, wherein the second electric field is configured to substantially limit diffusion of the exposed portion of the second photoresist layer to anisotropic diffusion;
removing the thermally-treated, exposed portion of the second photoresist layer; and
employing the second photoresist layer to form a second opening in the third material layer.

10. The method of claim 9 wherein at least one of the first and second electromagnetic radiation includes visible light.

11. The method of claim 9 wherein at least one of the first and second electromagnetic radiation includes ultraviolet (UV) light.

12. The method of claim 9 wherein at least one of the first and second electromagnetic radiation includes deep ultraviolet (DUV) light.

13. The method of claim 9 wherein at least one of the first and second electromagnetic radiation includes extreme ultraviolet (EUV) light.

14. The method of claim 9 wherein:
prior to treatment with thermal energy and being subjected to the first electric field, the exposed portion of the first photoresist layer has a first thickness that is substantially less than a second thickness of the first photoresist layer; and
prior to treatment with thermal energy and being subjected to the second electric field, the exposed portion of the second photoresist layer has a third thickness that is substantially less than a fourth thickness of the second photoresist layer.

15. The method of claim 14 wherein:
treating the first photoresist layer with thermal energy while subjecting the exposed portion of the first photoresist layer to the first electric field increases the first thickness towards the second thickness without substantially increasing a first width of the exposed portion of the first photoresist layer; and
treating the second photoresist layer with thermal energy while subjecting the exposed portion of the second photoresist layer to the second electric field increases the third thickness towards the fourth thickness without substantially increasing a second width of the exposed portion of the second photoresist layer.

16. The method of claim 9 wherein first electric field lines of the first electric field that pass through the exposed portion of the first photoresist layer are substantially parallel to second electric field lines of the second electric field that pass through the exposed portion of the second photoresist layer.

17. The method of claim 9 wherein second electric field lines of the second electric field are oriented at an obtuse angle relative to a normal of a surface of the substrate over which the second photoresist layer is located.

18. The method of claim 9, wherein the obtuse angle is approximately 135 degrees.

* * * * *